United States Patent
Nishio et al.

(10) Patent No.: US 8,933,464 B2
(45) Date of Patent: Jan. 13, 2015

(54) SIC EPITAXIAL WAFER AND SEMICONDUCTOR DEVICE

(71) Applicant: Kabushiki Kaisha Toshiba, Minato-ku (JP)

(72) Inventors: Johji Nishio, Tokyo (JP); Tatsuo Shimizu, Tokyo (JP); Chiharu Ota, Kanagawa (JP); Takashi Shinohe, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/205,792

(22) Filed: Mar. 12, 2014

(65) Prior Publication Data

US 2014/0284619 A1     Sep. 25, 2014

(30) Foreign Application Priority Data

Mar. 22, 2013   (JP) ................. 2013-059833

(51) Int. Cl.
| | |
|---|---|
| H01L 31/0312 | (2006.01) |
| H01L 29/16 | (2006.01) |
| H01L 21/02 | (2006.01) |
| C30B 29/36 | (2006.01) |

(52) U.S. Cl.
CPC ...... *H01L 29/1608* (2013.01); *H01L 21/02378* (2013.01); *H01L 21/02447* (2013.01); *H01L 21/02529* (2013.01); *H01L 21/02576* (2013.01); *H01L 21/02579* (2013.01); *C30B 29/36* (2013.01)
USPC .................. 257/77; 257/E29.104

(58) Field of Classification Search
CPC ................. H01L 29/1608; H01L 29/45
USPC ............... 257/72, E29.104
See application file for complete search history.

(56) References Cited

U.S. PATENT DOCUMENTS

| | | | |
|---|---|---|---|
| 2004/0212011 A1* | 10/2004 | Ryu | ............. 257/335 |
| 2010/0289033 A1 | 11/2010 | Ohtani et al. | |
| 2011/0001209 A1* | 1/2011 | Watanabe et al. | ............. 257/484 |
| 2012/0025153 A1 | 2/2012 | Hirose et al. | |
| 2012/0228630 A1 | 9/2012 | Shimizu et al. | |

FOREIGN PATENT DOCUMENTS

| | | |
|---|---|---|
| DE | 4325804 A1 | 2/1995 |
| JP | 2009-167047 | 7/2009 |
| JP | 2012-31014 | 2/2012 |

OTHER PUBLICATIONS

U.S. Appl. No. 14/205,964, filed Mar. 12, 2014, Ota, et al.

(Continued)

*Primary Examiner* — David S Blum
(74) *Attorney, Agent, or Firm* — Oblon, Spivak, McClelland, Maier & Neustadt, L.L.P.

(57) ABSTRACT

An SiC epitaxial wafer of an embodiment includes, an SiC substrate, and a p-type first SiC epitaxial layer that is formed on the SiC substrate and contains a p-type impurity and an n-type impurity. An element A and an element D being a combination of Al (aluminum), Ga (gallium), or In (indium) and N (nitrogen), and/or a combination of B (boron) and P (phosphorus) when the p-type impurity is the element A and the n-type impurity is the element D. The ratio of the concentration of the element D to the concentration of the element A in the combination(s) is higher than 0.33 but lower than 1.0.

20 Claims, 11 Drawing Sheets

(56) References Cited

OTHER PUBLICATIONS

U.S. Appl. No. 14/205,887, filed Mar. 12, 2014, Shimizu, et al.

U.S. Appl. No. 14/205,914, filed Mar. 12, 2014, Shimizu, et al.

U.S. Appl. No. 14/206,241, filed Mar. 12, 2014, Nishio, et al.

U.S. Appl. No. 14/205,854, filed Mar. 12, 2014, Ota, et al.

European Search Report issued Aug. 8, 2014 in European Patent Application No. 14155484.0-1552.

Masanori Miyata, et al., "Theoretical Study of Acceptor- Donor Complexes in 4H-SiC", The Japan Society of Applied Physics, vol. 1, Oct. 24, 2008, pp. 111401-1 through 111401-3.

Zhiguo Wang, et al., "First principles of study of p-type doping in SiC nanowires: role of quantum effect", Journal of Nanoparticle Research, vol. 13, No. 7, Dec. 22, 2010, pp. 2887-2892.

\* cited by examiner

US 8,933,464 B2

SIC EPITAXIAL WAFER AND SEMICONDUCTOR DEVICE

CROSS-REFERENCE TO RELATED APPLICATION

This application is based upon and claims the benefit of priority from Japanese Patent Application No. 2013-059833, filed on Mar. 22, 2013, the entire contents of which are incorporated herein by reference.

FIELD

Embodiments described herein relate generally to an sic epitaxial wafer and a semiconductor device.

BACKGROUND

SiC (silicon carbide) is expected to be a material for next-generation power semiconductor devices. SiC has excellent physical properties, having a band gap three times wider than that of Si (silicon), a breakdown field strength approximately 10 times higher than that of Si, and a heat conductivity approximately three times higher than that of Si. A power semiconductor device that has low loss and is capable of high-temperature operation can be realized by taking advantage of those properties.

With SiC, however, it is difficult to lower the resistance of a p-type impurity layer or an n-type impurity layer, because the solid solubility limit of the impurity is low, and the levels formed with the impurity in the band gap are deep.

DETAILED DESCRIPTION

Figure 1:
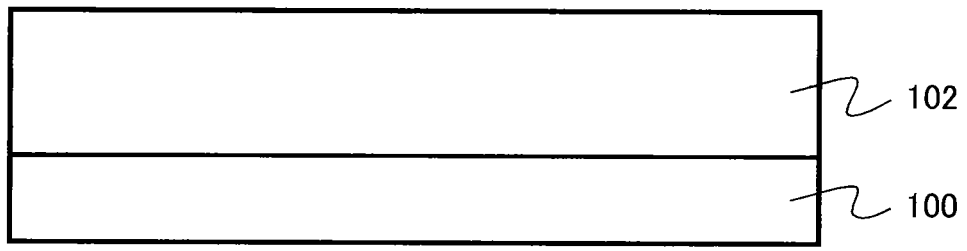
FIG. 1 is a schematic cross-sectional view of an SiC epitaxial wafer of a first embodiment.

An SiC epitaxial wafer of an embodiment includes: an SiC substrate; and a p-type first SiC epitaxial layer that is formed on the SiC substrate and contains a p-type impurity and an n-type impurity, the p-type impurity being an element A and the n-type impurity being an element D, the element A and the element D forming at least a first combination or a second combination, the first combination being a combination of the element A selected from a group consisting of Al (aluminum), Ga (gallium), and In (indium) and the element D being N (nitrogen), the second combination being a combination of the element A being B (boron) and the element D being P (phosphorus), the ratio of the concentration of the element D to the concentration of the element A in the combination(s) being higher than 0.33 but lower than 1.0.

The following is a description of embodiments, with reference to the accompanying drawings. In the following description, like components are denoted by like reference numerals, and explanation of components described once will not be repeated.

In the following description, $n^+$, $n$, $n^-$, $p^+$, $p$, and $p^-$ indicate relative levels of impurity concentrations in the respective conductivity types. Specifically, the concentration of an $n^+$-type impurity is relatively higher than the concentration of the corresponding n-type impurity, and the concentration of an $n^-$-type impurity is relatively lower than the concentration of the corresponding n-type impurity. Likewise, the concentration of a $p^+$-type impurity is relatively higher than the concentration of the corresponding p-type impurity, and the concentration of a $p^-$-type impurity is relatively lower than the concentration of the corresponding p-type impurity. It should be noted that there are cases where an $n^+$ type and an $n^-$ type are referred to simply as an n-type, and a $p^+$ type and a $p^-$ type are referred to simply as a p-type.

(First Embodiment)

An SiC epitaxial wafer of this embodiment includes: an SiC substrate; and a p-type first SiC epitaxial layer that is formed on the SiC substrate and contains a p-type impurity and an n-type impurity, an element A and an element D being a combination of Al (aluminum), Ga (gallium), or In (indium) and N (nitrogen), and/or a combination of B (boron) and P (phosphorus) when the p-type impurity is the element A and the n-type impurity is the element D. In other words, when the p-type impurity is an element A and the n-type impurity is an element D, the element A and the element D form at least a first combination or a second combination, the first combination being a combination of the element A selected from a group consisting of Al (aluminum), Ga (gallium), and In (indium) and the element D being N (nitrogen), the second combination being a combination of the element A being B (boron) and the element D being P (phosphorus). The ratio of the concentration of the element D to the concentration of the element A in the combination(s) is higher than 0.33 but lower than 1.0.

FIG. 1 is a schematic cross-sectional view of the SiC epitaxial wafer of this embodiment. The SiC epitaxial wafer of this embodiment has a p-type SiC epitaxial layer (the first SiC epitaxial layer) 102 on an SiC substrate 100.

The SiC substrate 100 is an $n^+$-type single-crystal SiC substrate, for example. The SiC substrate 100 is a 4H—SiC substrate having a surface inclined at an off-angle of 0.2 to 10 degrees to the (0001) plane. The n-type impurity is N (nitrogen), for example, and the impurity concentration is not lower than $5 \times 10^{17}$ cm$^{-3}$ and not higher than $5 \times 10^{19}$ cm$^{-3}$, for example.

The p-type SiC epitaxial layer (the first SiC epitaxial layer) 102 is formed through epitaxial growth. In a case where the p-type SiC epitaxial layer 102 contains a p-type impurity and an n-type impurity, and the p-type impurity is an element A while the n-type impurity is an element D, the element A and the element D are a combination of Al (aluminum), Ga (gallium), or In (indium) and N (nitrogen), and/or a combination of B (boron) and P (phosphorus). The ratio of the concentration of the element D to the concentration of the element A in the above combination (s) is higher than 0.33 but lower than 1.0.

The p-type impurity concentration or the concentration of the element A in the p-type SiC epitaxial layer 102 is not lower than $1\times10^{15}$ cm$^{-3}$ and not higher than $1\times10^{22}$ cm$^{-3}$, for example. The concentration of the element A may be a constant value within the above range, or may exhibit a concentration gradient within the above range.

The SiC epitaxial wafer of this embodiment realizes a low-resistance p-type SiC epitaxial layer with the above described structure.

The concentration of the element A in the p-type SiC epitaxial layer 102 is not lower than $1\times10^{18}$ cm$^{-3}$ and not higher than $1\times10^{22}$ cm$^{-3}$. So as to lower resistance, the concentration of the element A is preferably not lower than $1\times10^{19}$ cm$^{-3}$ and not higher than $1\times10^{22}$ cm$^{-3}$, or more preferably, not lower than $1\times10^{20}$ cm$^{-3}$ and not higher than $1\times10^{22}$ cm$^{-3}$.

So as to lower resistance, the ratio of the concentration of the element D to the concentration of the element A in the p-type SiC epitaxial layer 102 is preferably higher than 0.40 but lower than 0.95, the acceptor levels of the element A are preferably 150 meV or lower, and 90% or more of the element D is preferably located in the lattice site location nearest to the element A.

The SiC epitaxial layer of this embodiment that is co-doped with an n-type impurity and a p-type impurity is described below in detail.

It has become apparent from the results of studies made by the inventors that pairing between Al and N can be caused by co-doping SiC with Al as the p-type impurity (p-type dopant) and N as the n-type impurity (n-type dopant). In this pairing state, carrier compensation occurs, and a zero-carrier state is formed.

Figure 2:
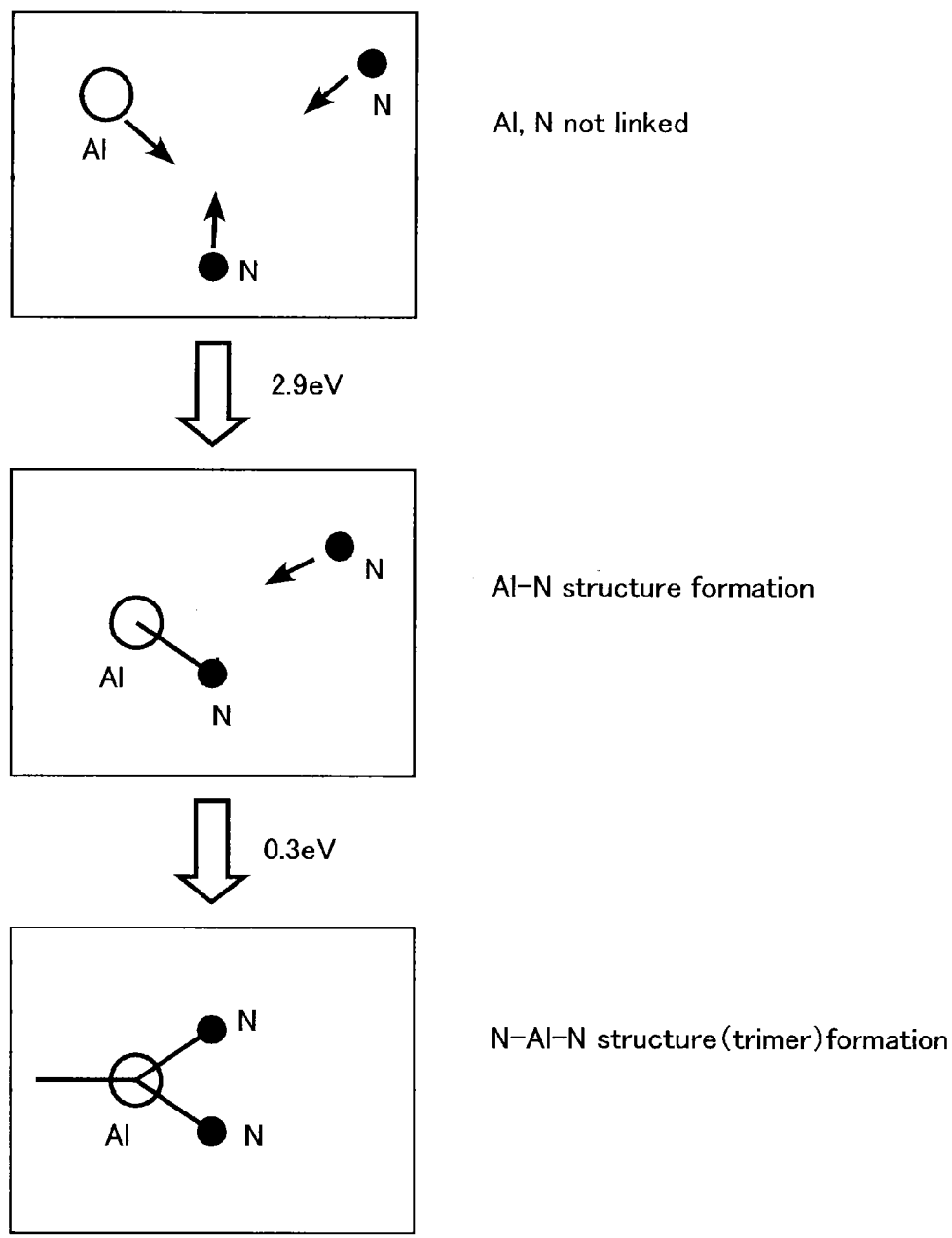
FIG. 2 is a diagram for explaining the function of co-doping.
Figure 3:
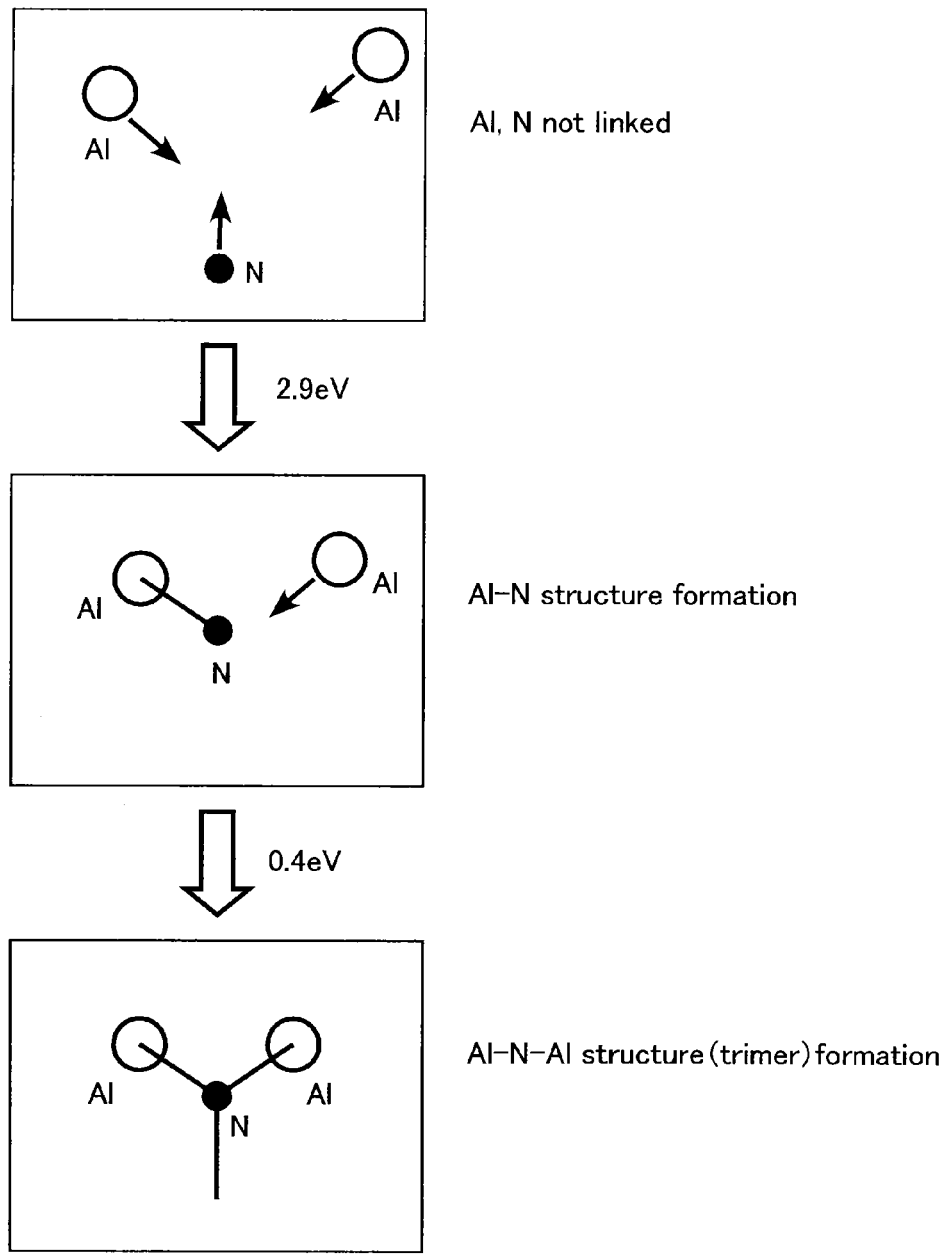
FIG. 3 is a diagram for explaining the function of co-doping.

FIGS. 2 and 3 are diagrams for explaining the function of co-doping. FIG. 2 shows the case of n-type SiC, and FIG. 3 shows the case of p-type SiC. It has become apparent from the first principle calculation performed by the inventors that Al enters Si (silicon) sites and N enters C (carbon) sites in SiC so that Al and N become adjacent to each other, and, as a result, the system becomes more stable.

Specifically, as shown in FIGS. 2 and 3, where Al and N are linked to each other to form Al—N pair structures, the system becomes 2.9 eV more stable in terms of energy than a system in which Al and N are not linked to each other but exist independently of each other. If the Al amount and the N amount are the same, the most stable state is achieved when all of the two elements form pair structures.

Here, the first principle calculation is a calculation using ultrasoft pseudopotential. Ultrasoft pseudopotential is a type of pseudopotential, and was developed by Vanderbilt et al. For example, a lattice constant has such a high precision as to realize experimental values with a margin of error of 1% or less. Structural relaxation is achieved by introducing impurities (dopant), and the entire energy of a stable state is calculated. The energy of the entire system after a change is compared with the energy prior to the change, so as to determine which structures are in a stable state. In a stable state, in which energy positions impurity levels are located in the band gap can be indicated.

As shown in FIG. 2, it has become apparent that, in a case where the amount of N is larger than the amount of Al, or in the case of n-type SiC, extra N enters C sites located in the vicinities of Al—N pair structures, to form N—Al—N trimers and further stabilize the system. According to the first principle calculation, trimers are formed, and the system becomes 0.3 eV more stable than a system in which pair structures exist separately from N.

Likewise, as shown in FIG. 3, it has become apparent that, in a case where the amount of Al is larger than the amount of N, or in the case of p-type SiC, extra Al enters Si sites located in the vicinities of Al—N pair structures, to form Al—N—Al trimers and further stabilize the system. According to the first principle calculation, trimers are formed, and the system becomes 0.4 eV more stable than a system in which Al—N pair structures exist separately from Al.

Next, dopant combinations other than the combination of Al and N are discussed. Calculation results obtained in a case where a calculation was conducted for a combination of B (boron) and N (nitrogen) are described below.

B enters Si sites, and N enters C sites. According to the first principle calculation, B—N—B or N—B—N trimeric structures cannot be formed. Specifically, B—N pair structures are formed, but the energy of the system becomes higher when B or N approaches the B—N pair structures. Accordingly, the system is more stable in terms of energy when extra B or N exists in positions sufficiently away from the pair structures.

According to the first principle calculation, when extra B forms trimers, the energy of the system is 0.5 eV higher than that in a case where B—N pairs exist independently of B. Also, when extra N forms trimers, the energy of the system is 0.3 eV higher than that in a case where B—N pairs exist independently of N. Therefore, in either case, the system becomes unstable in terms of energy when trimers are formed.

Figure 4:
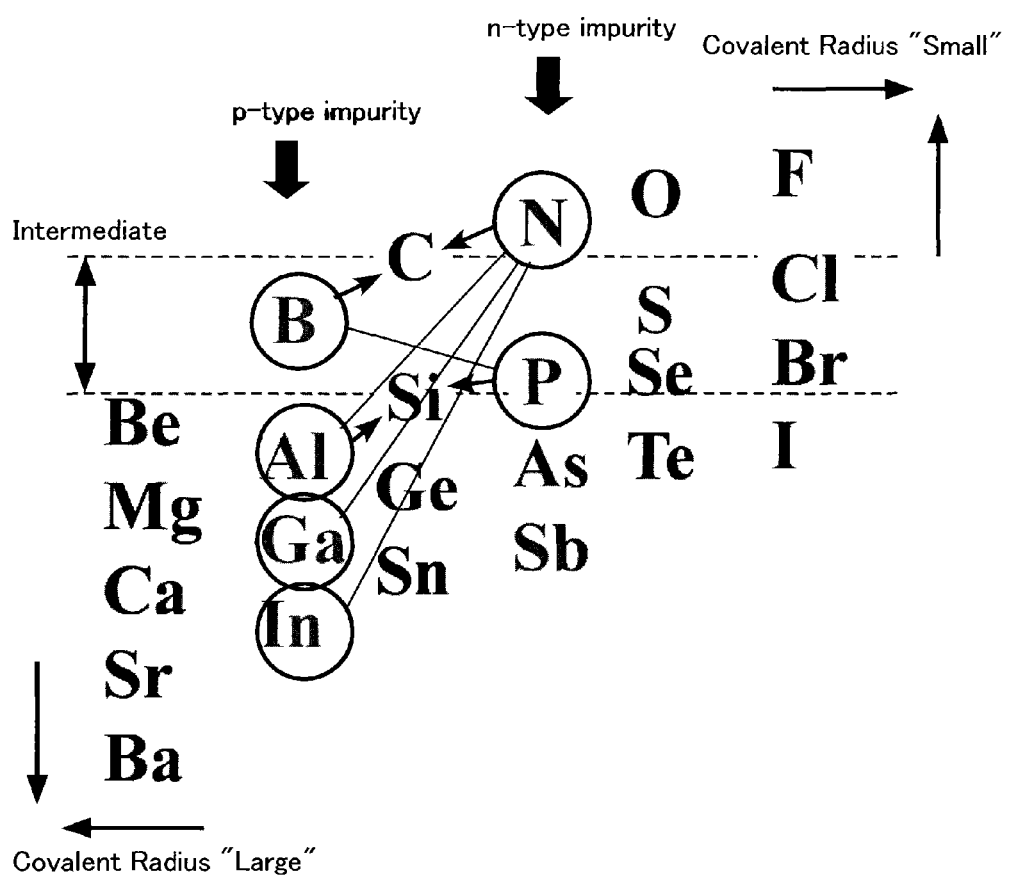
FIG. 4 is a diagram for explaining the function of co-doping.

FIG. 4 is a diagram for explaining the function of co-doping. FIG. 4 shows the covalent radii of respective elements. Elements with smaller covalent radii are shown in the upper right portion in the drawing, and elements with larger covalent radii are shown in the lower left portion.

Considering the covalent radii, it is understandable that the system becomes unstable when trimers are formed with B and N. The covalent radius of B is smaller than the covalent radius of Si, and the covalent radius of N is smaller than the covalent radius of C. Therefore, when B enters Si sites and N enters C sites, strain accumulates, and trimers cannot be formed.

It has become apparent that trimers are not formed with combinations of the p-type impurity and the n-type impurity as dopant other than the combinations of "an element (Al, Ga, or In) having a larger covalent radius than Si" and "an element (N) having a smaller covalent radius than C", and the reverse combination of "an element (B) having a larger covalent radius than C" and "an element (P) having a smaller covalent radius than Si".

Since the covalent radii of B and P are between the covalent radius of Si and the covalent radius of C, B and P can enter both Si sites and C sites. However, the other impurities (Al, Ga, In, N, and As) basically enter either Si sites or C sites. It is safe to say that Al, Ga, In, and As enter Si sites, and N enters C sites.

Furthermore, when both impurities enter Si sites or both impurities enter C sites, there is no need to take into account such an aspect. This is because it is difficult to relax strain unless the p-type impurity and the n-type impurity are located at the closest distance from each other. Therefore, where the p-type impurity is the element A and the n-type impurity is the element D, it is difficult to form trimers with combinations of the element A and the element D other than the four combinations of "Al and N", "Ga and N", "In and N", and "B and P".

The pair structures or the trimeric structures cannot be formed unless there is interaction between atoms. If approximately 10 unit cells exist in the c-axis direction, the interaction is invisible, and the impurity levels (dopant levels) in a 4H—SiC structure according to the first principle calculation are in a flat state. That is, diffusion is sufficiently restrained, and is on the order of approximately 10 meV.

In other words, it is considered that there is little interaction when the distance between impurities is 10 nm or longer. In view of this, to maintain interaction between impurities, the impurity concentrations are preferably $1\times10^{18}$ cm$^{-3}$ or higher.

This value is the lower limit of impurity concentrations that is desired when a local impurity distribution is formed through ion implantation in a case where an SiC material has already been formed.

To cause an effect of co-doping to appear in semiconductor SiC, the ratio between the n-type impurity concentration and the p-type impurity concentration needs to be restricted within a specific range. By the later described manufacturing method, it is critical that the ratio between the n-type and p-type impurities to be introduced by ion implantation be set at a ratio within the specific range from the start. Although the reach of interaction is as short as less than 10 nm, trimers can be formed by virtue of the attraction force of each other within the reach. Furthermore, as the attraction force is applied, the temperature of the activating anneal for the impurities can be lowered from 1700-1900° C., which is the temperature range in a case where co-doping is not performed, to 1500-1800° C.

However, the impurity concentration desirable for trimer formation can be lowered in crystal growth from a vapor phase by CVD (Chemical Vapor Deposition) or the like. This is because raw material can be made to flow in the surface, and accordingly, interaction between the impurities can easily occur at low concentrations.

In vapor phase growth, the range of impurity concentrations for trimer formation is $1\times10^{15}$ cm$^3$ to $1\times10^{22}$ cm$^{-3}$, which is wider than that with ion implantation. In vapor phase growth, it is possible to lower the impurity concentration in SiC to approximately $1\times10^{16}$ cm$^{-3}$ or increase the impurity concentration in SiC to approximately $1\times10^{21}$ cm$^{-3}$, for example. Particularly, it is difficult to form a low-concentration region through ion implantation. Therefore, impurity region formation through vapor phase growth is particularly effective in a low-concentration region. Furthermore, it is possible to form a co-doped film as thin as 5 nm, for example, through vapor phase growth.

Vapor phase growth also has the advantage that defects in crystals are not easily formed in regions containing impurities at high concentrations. In the case of ion implantation, defects in crystals increase as the amount of introduced impurities becomes larger, and recovery through a heat treatment or the like also becomes difficult. By vapor phase growth, trimers are formed during the growth, and defects due to impurity implantation are hardly formed. In view of this, impurity region formation through vapor phase growth is effective in regions having impurity concentrations of $1\times10^{19}$ cm$^{-3}$ or higher, or more preferably, $1\times10^{20}$ cm$^{-3}$ or higher, for example.

As described above, vapor phase growth has effects that cannot be achieved by ion implantation. However, impurity regions that are locally co-doped can be formed through ion implantation. Also, co-doped impurity regions can be formed at low costs. Therefore, either vapor phase growth or ion implantation should be used where appropriate.

When trimers are to be formed at the time of crystal growth from a vapor phase, the concentrations of the p-type and n-type impurities are preferably $1\times10^{15}$ cm$^{-3}$ or higher. Further, so as to facilitate the trimer formation, the impurity concentrations are preferably $1\times10^{16}$ cm$^3$ or higher.

When trimers are formed, the upper limit of impurity concentrations may exceed the solid solubility limit of cases where trimers are not formed. This is because, when trimers are formed, strain in crystals is relaxed, and the impurities are easily solved.

The impurity solid solubility limit in a case where trimers are not formed is on the order of $10^{19}$ cm$^{-3}$ in the case of N, and is on the order of $10^{21}$ cm$^{-3}$ even in the case of Al. As for the other impurities, the solid solubility limit is on the order of approximately $10^{21}$ cm$^{-3}$.

When only one type of impurity is used, the size of the impurity is either small or large. Therefore, strain accumulates, and the impurity cannot easily enter lattice points. As a result, activation cannot be caused. Particularly, in the case of ion implantation, a large number of defects are formed, and the solid solubility limit becomes even lower.

However, when trimers are formed, both Al and N can be implanted up to the order of approximately $10^{22}$ cm$^{-3}$. As strain can be relaxed by forming trimers with one of the four combinations of "Al and N", "Ga and N", "In and N", and "B and P", the solid solubility limit can be extended. As a result, the impurity solid solubility limit can be extended to the order of $10^{22}$ cm$^{-3}$.

In a case where the impurity is B, Al, Ga, In, or P, strain is large, and a large number of defects exist, if the impurity concentration is $1\times10^{20}$ cm$^{-3}$ or higher, or more particularly, $6\times10^{20}$ cm$^3$ or higher. As a result, sheet resistance or resistivity becomes very high.

However, co-doping with the p-type impurity and the n-type impurity can reduce defects even in regions having such high impurity concentrations.

When an impurity is N, the solid solubility limit is further lowered by one digit to approximately $2\times10^{19}$ cm$^{-3}$. According to the first principle calculation, this is probably because defects of inactive interstitial N are formed.

As trimers are formed, the upper limit of the N concentration is dramatically increased from the order of $10^{19}$ cm$^{-3}$ to the order of $10^{22}$ cm$^{-3}$. In a case where an n-type region doped at a high concentration is to be formed, nitrogen cannot be normally used, and P ions are implanted at approximately $10^{20}$ cm$^{-3}$, for example. In this embodiment, however, an n-type region doped at a high concentration can be formed by using nitrogen. For example, N is implanted at $2\times10^{20}$ cm$^{-3}$, and Al is implanted at $1\times10^{20}$ cm$^{-3}$. It is normally difficult to use nitrogen, but nitrogen can be used in this embodiment.

As described above, both the p-type impurity and the n-type impurity are implanted, and an appropriate combination of covalent radii is selected, so that trimers can be formed. The structures are then stabilized, and strain can be reduced.

As a result, (1) the respective impurities can easily enter lattice points, (2) the process temperature can be lowered, and a temperature decrease of at least 100° C. can be expected, (3) the amount of impurities that can be activated increases (the upper limit is extended), (4) stable structures such as trimers or pair structures can be formed, and entropy is increased and crystal defects are reduced with the structures, and (5) as the trimers are stable, revolutions around the bonds that bind the p-type impurity and the n-type impurity become difficult, and the structures are immobilized. Accordingly, energization breakdown tolerance becomes dramatically higher. For example, when trimeric structures are formed in at least part of the p-type impurity region and the n-type impurity region of a pn junction, energization breakdown is restrained, and an increase in resistance can be avoided. As a result, a degradation phenomenon (Vf degradation) in which the voltage (Vf) required to be applied so as to apply a certain amount of current becomes higher can be restrained.

As described above, pairing between Al and N can be caused by co-doping with Al as the p-type impurity and N as the n-type impurity. Furthermore, it has become apparent from the first principle calculation that both acceptor levels and donor levels can be made shallower at this point.

Figure 5:
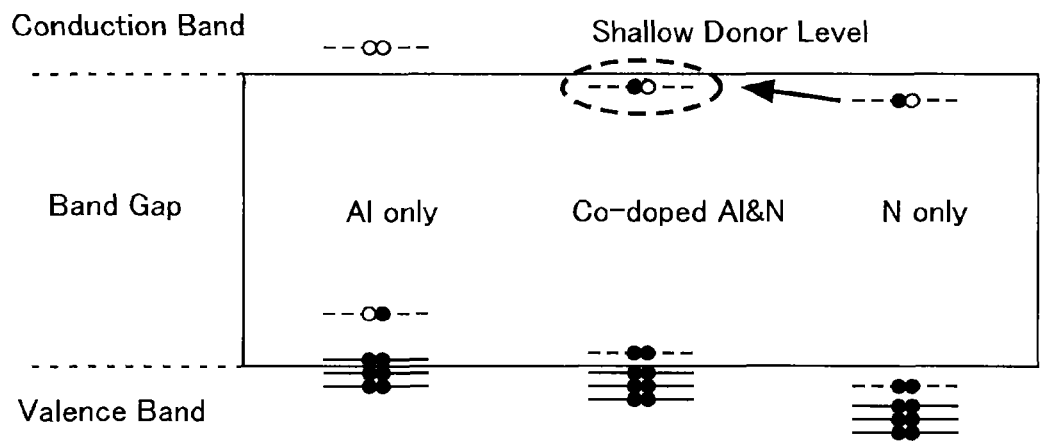
FIG. 5 is a diagram for explaining the function of co-doping.
Figure 6:
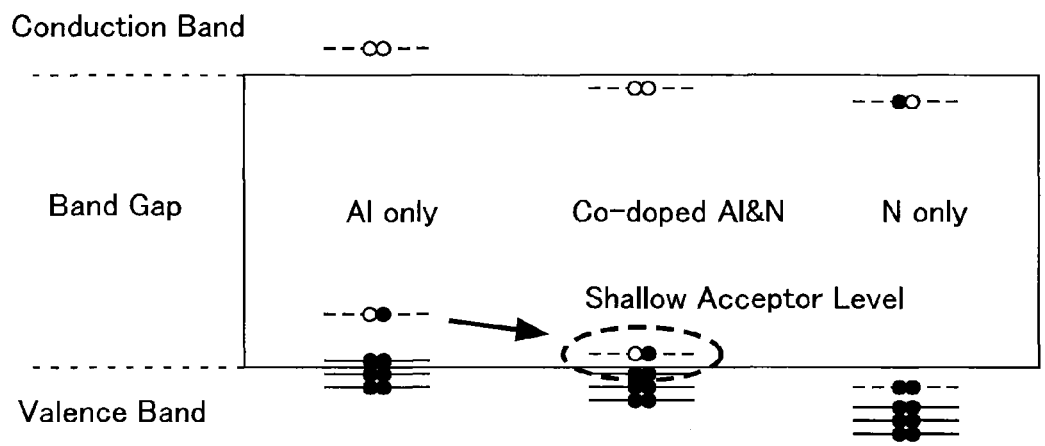
FIG. 6 is a diagram for explaining the function of co-doping.

FIGS. 5 and 6 are diagrams for explaining the function of co-doping. FIG. 5 illustrates a case of n-type SiC, and FIG. 6 illustrates a case of p-type SiC. White circles represent empty levels not filled with electrons, and black circles represent levels filled with electrons.

The reason that the donor levels become shallower is that the empty levels located within the conduction band of Al as the acceptor interact with the donor levels of N, and the donor levels are raised, as shown in FIG. 5. Likewise, the reason that the acceptor levels become shallower is that the levels that are filled with electrons and are located within the valence band of N as the donor interact with the acceptor levels of Al, and the acceptor levels are lowered, as shown in FIG. 6.

Normally, N or P (phosphorus) as the n-type impurity forms donor levels that are as deep as 42 to 95 meV. B, Al, Ga, or In as the p-type impurity forms very deep acceptor levels of 160 to 300 meV. If trimers are formed, on the other hand, the n-type impurity can form donor levels of 35 meV or lower, and the p-type impurity can form acceptor levels of 100 meV or lower.

In an optimum state where trimers are completely formed, n-type N or P forms levels of approximately 20 meV, and p-type B, Al, Ga, or In forms levels of approximately 40 meV. As such shallow levels are formed, most of the activated impurities turn into carriers (free electrons and free holes). Accordingly, the bulk resistance becomes one or more digits lower than that in a case where co-doping is not performed.

In the case of n-type SiC, the donor levels that contribute to carrier generation becomes 40 meV or lower, and as a result, the resistance becomes lower than that in a case where co-doping is not performed. Also, as the donor levels become 35 meV or lower, the resistance is lowered by approximately one digit. As the donor levels become 20 meV or lower, the resistance is lowered by approximately two digits. However, a strain relaxation effect and a doping upper limit extension effect are also achieved.

In the case of p-type SiC, the acceptor levels that contribute to carrier generation becomes 150 meV or lower, and as a result, the resistance becomes lower than that in a case where co-doping is not performed. Also, as the acceptor levels become 100 meV or lower, the resistance is lowered by approximately one digit. As the acceptor levels become 40 meV or lower, the resistance is lowered by approximately two digits. However, a strain relaxation effect and a doping upper limit extension effect are also achieved.

When the Al concentration and the N concentration are the same (N:Al=1:1), an insulator is formed, because there are no carriers though there are shallow levels. There exist carriers that are equivalent to a difference between the Al concentration and the N concentration. To form a low-resistance semiconductor, a concentration difference is required.

When the N concentration is higher than the Al concentration (N concentration>Al concentration), extra N generated as a result of formation of Al—N pairs through interaction is also stabilized by displacing C located in the vicinities of the Al—N pairs. Accordingly, shallow donor levels are formed. Also, strain is relaxed. Accordingly, the N concentration can be made higher than that in a case where trimers are not formed.

Figure 7:
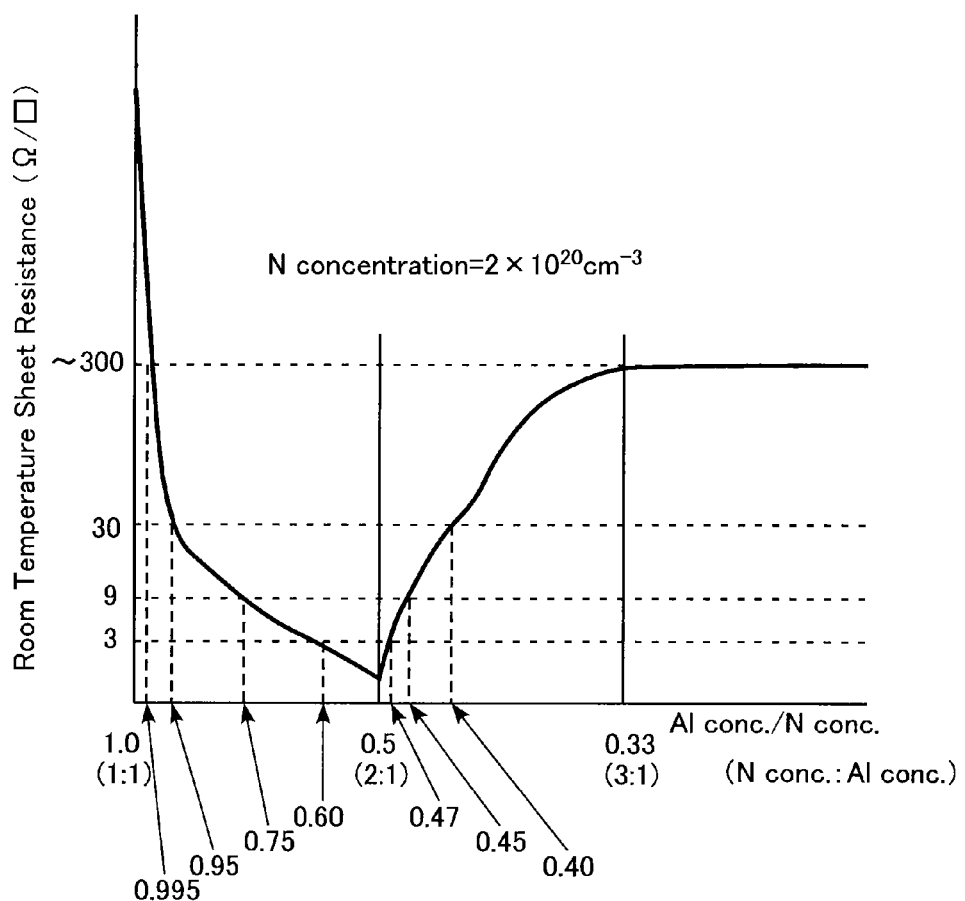
FIG. 7 is a diagram showing the relationship between Al and N concentrations and sheet resistance in the case of n-type SiC.

FIG. 7 is a diagram showing the relationship between Al and N concentrations and sheet resistance in the case of n-type SiC. The N concentration is $2 \times 10^{20}$ cm$^{-3}$. When only N is implanted, the sheet resistance cannot be lowered even if N is implanted at $1 \times 10^{19}$ cm$^3$ or higher. The value is approximately 300 Ω/□.

While "N concentration:Al concentration" is changing from 1:1 to 2:1, trimers are formed without strain, and the number of carrier electrons in the shallow donor levels increases. Accordingly, the sheet resistance rapidly decreases.

When the ratio reaches 2:1, the maximum amount of carriers is available, and the sheet resistance becomes lowest. As shown in FIG. 7, the sheet resistance can be lowered down to approximately 1.5Ω/□. The contact resistance to n-type SiC can also be lowered from approximately $10^{-5}$ Ωcm$^3$ to approximately $10^{-7}$ Ωcm$^3$ by making "N concentration:Al concentration" equal to 2:1 and increasing the difference between the N concentration and the Al concentration from $10^{20}$ cm$^{-3}$ to $10^{22}$ cm$^{-3}$.

Furthermore, if the ratio of the N concentration becomes higher than 2:1, the original deep donor levels are formed by the extra N that exceeds "N concentration:Al concentration=2:1". The donor levels receive carrier electrons, and the shallow donor levels formed with trimers become empty. The excess N left out from "N concentration:Al concentration=2:1" is similar to N introduced independently. Therefore, strain relaxation is difficult. As a result, the sheet resistance rapidly increases as shown in FIG. 7.

In FIG. 7, the target for comparison is the sheet resistance (approximately 300Ω/□ in this case) in a case where N (nitrogen) as the n-type impurity is implanted almost up to the solid solubility limit when co-doping with Al is not performed, and changes in the sheet resistance value seen when "N concentration:Al concentration" is changed from 2:1 are shown.

The following description centers around "Al concentration/N concentration=0.5", at which trimer structures are formed. In a case where "Al concentration/N concentration" is not lower than 0.47 and not higher than 0.60 (100% of the carriers of $8 \times 10^{19}$ cm$^{-3}$ or higher being free carriers), or where the p-type impurity is implanted at 47 to 60% with respect to the n-type impurity, the sheet resistance is two digits lower than the sheet resistance obtained in a case co-doping with Al is not performed. Such a concentration ratio is highly advantageous. When the ratio is lower than 0.5, shallow levels decrease, and strain is caused. As a result, the number of free carriers decreases, and carriers equivalent to $8 \times 10^{19}$ cm$^{-3}$ are obtained when the ratio is approximately 0.47.

In a case where the range is widened in both directions, and "Al concentration/N concentration" is not lower than 0.45 and not higher than 0.75 (100% of the carriers of $5 \times 10^{19}$ cm$^{-3}$ or higher being free carriers), or where Al is implanted at 45 to 75% with respect to N, the sheet resistance ranges from a two-digit-lower resistance to a resistance almost three times higher than the two-digit-lower resistance. When the ratio is lower than 0.5, shallow levels decrease, and strain is caused. As a result, the number of free carriers decreases, and carriers equivalent to $5 \times 10^{19}$ cm$^{-3}$ are obtained when the ratio is approximately 0.45. In a case where the range is further widened in both directions and "Al concentration/N concentration" is higher than 0.40 but lower than 0.95 (100% of the carriers of $1 \times 10^{19}$ cm$^{-3}$ or higher being free carriers), or where Al is implanted at 40 to 95% with respect to N, the sheet resistance becomes one digit lower. When the ratio is lower than 0.5, shallow levels decrease, and strain is caused. As a result, the number of free carriers decreases, and carriers equivalent to $1\times10^{19}$ cm$^{-3}$ are obtained when the ratio is approximately 0.40.

Better characteristics are achieved on the side where Al is implanted at 50% or more with respect to N, because strain is sufficiently relaxed. The 50% state is the state where two N atoms and one Al atom are clustered to form a trimer. When the ratio is lower than 50%, trimers are formed, and extra N exists. Since there is N that cannot form trimers, an equivalent amount of strain accumulates. N that cannot form trimers is the same as that introduced independently, and reaches the limit of strain in no time. When the amount of Al is lower than 50%, strain rapidly occurs, and lattice defects increase. Therefore, the sheet resistance rapidly deteriorates when the ratio is lower than 50%, compared with that in a case where the ratio is 50% or higher at which strain can be relaxed.

When "Al concentration/N concentration" is 0.995, the number of carriers is almost the same as that in a case where co-doping is not performed. Since 100% of the carriers of $1\times10^{18}$ cm$^{-3}$ or higher, which is 0.5% of $2\times10^{20}$ cm$^{-3}$, are free carriers, the sheet resistance to be obtained with conventional nitrogen doping can be realized. Accordingly, the sheet resistance is almost the same as that in a case where co-doping is not performed. In a case where "Al concentration/N concentration" is 0.33 or where "N concentration:Al concentration" is 3:1, all carrier electrons are received not by shallow donor levels formed with trimers but by deep donor levels formed with extra N. Accordingly, the sheet resistance is almost the same as that in a case where co-doping is not performed. Therefore, the resistance is lowered by co-doping in cases where "Al concentration/N concentration" is higher than 0.33 but lower than 0.995, or where Al is implanted at 33 to 99.5% with respect to N. With the margin of error being taken into account, it can be considered that the ratio of Al to N should be higher than 33% but lower than 100%.

When the Al concentration is higher than the N concentration (Al concentration>N concentration), extra Al generated as a result of formation of Al—N pairs through interaction is also stabilized by displacing Si located in the vicinities of the Al—N pairs. Accordingly, shallow acceptor levels are formed. Also, strain is relaxed. Accordingly, the Al concentration can be made higher than that in a case where trimers are not formed. This case can be considered to be the same as the case where the N concentration is higher than the Al concentration.

Figure 8:
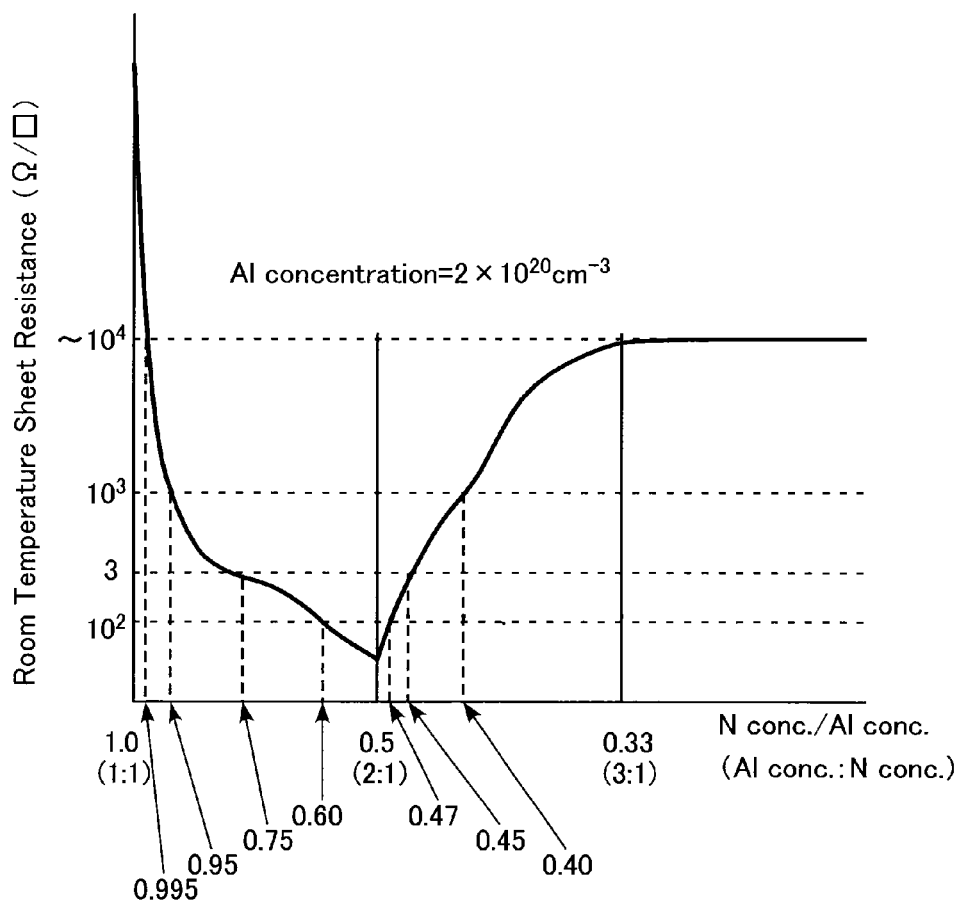
FIG. 8 is a diagram showing the relationship between N and Al concentrations and sheet resistance in the case of p-type SiC.

FIG. 8 is a diagram showing the relationship between N and Al concentrations and sheet resistance in the case of p-type SiC; The Al concentration is $2\times10^{20}$ cm$^{-3}$.

While "Al concentration:N concentration" is changing from 1:1 to 2:1, trimers are formed without strain, and the number of carrier holes in the shallow acceptor levels increases. Accordingly, the sheet resistance decreases.

When the ratio reaches 2:1, the maximum amount of carriers is available, and the sheet resistance becomes lowest. As shown in FIG. 8, the sheet resistance can be lowered down to approximately 40Ω/□. The contact resistance to p-type SiC can also be lowered from approximately $10^{-5}$ Ωcm$^3$ to approximately $10^{-7}$ Ωcm$^3$ by making "Al concentration:N concentration" equal to 2:1 and increasing the difference between the Al concentration and the N concentration from $10^{20}$ cm$^{-3}$ to $10^{22}$ cm$^{-3}$.

Furthermore, if the ratio of the Al concentration becomes higher than 2:1, the original deep acceptor levels are formed by the extra Al that exceeds "Al concentration:N concentration=2:1". The acceptor levels receive carrier holes, and the shallow acceptor levels formed with trimers are filled with electrons. The excess Al left out from "Al concentration:N concentration=2:1" is similar to N introduced independently. Therefore, strain relaxation is difficult. As a result, the sheet resistance rapidly increases as shown in FIG. 8.

In FIG. 8, the target for comparison is the sheet resistance (approximately 10 KΩ/□ in this case) in a case where Al (aluminum) as the p-type impurity is implanted almost up to the solid solubility limit when co-doping with N is not performed, and changes in the sheet resistance value seen when "Al concentration:N concentration" is changed from 2:1 are shown.

The following description centers around "N concentration/Al concentration=0.5", at which trimer structures are formed. In a case where "N concentration/Al concentration" is not lower than 0.47 and not higher than 0.60 (100% of the carriers of $8\times10^{19}$ cm$^{-3}$ or higher being free carriers), or where the n-type impurity is implanted at 47 to 60% with respect to the p-type impurity, the sheet resistance is two digits lower than the sheet resistance obtained in a case co-doping with N is not performed. Such a concentration ratio is highly advantageous. When the ratio is lower than 0.5, shallow levels decrease, and strain is caused. As a result, the number of free carriers decreases, and carriers equivalent to $8\times10^{19}$ cm$^{-3}$ are obtained when the ratio is approximately 0.47.

In a case where the range is widened in both directions, and "N concentration/Al concentration" is not lower than 0.45 and not higher than 0.75 (100% of the carriers of $5\times10^{19}$ cm$^{-3}$ or higher being free carriers), or where N is implanted at 45 to 75% with respect to Al, the sheet resistance ranges from a two-digit-lower resistance to a resistance almost three times higher than the two-digit-lower resistance. When the ratio is lower than 0.5, shallow levels decrease, and strain is caused. As a result, the number of free carriers decreases, and carriers equivalent to $5\times10^{19}$ cm$^{-3}$ are obtained when the ratio is approximately 0.45. In a case where the range is further widened in both directions and "N concentration/Al concentration" is higher than 0.40 but lower than 0.95 (100% of the carriers of $1\times10^{19}$ cm$^{-3}$ or higher being free carriers), or where N is implanted at 40 to 95% with respect to Al, the sheet resistance becomes one digit lower. When the ratio is lower than 0.5, shallow levels decrease, and strain is caused. As a result, the number of free carriers decreases, and carriers equivalent to $1\times10^{19}$ cm$^3$ are obtained when the ratio is approximately 0.40.

Better characteristics are achieved in cases where N is implanted at 50% or more with respect to Al, because strain is sufficiently relaxed. When N is less than 50%, on the other hand, trimers formed with one N atom and two Al atoms that are clustered account for 50% of the entire structure, and further, Al exists therein. Since there is Al that cannot form trimers, an equivalent amount of strain accumulates. When the amount of N is lower than 50%, strain rapidly occurs, and lattice defects increase. Therefore, the sheet resistance rapidly deteriorates when the ratio is lower than 50%, compared with that in a case where the ratio is 50% or higher at which strain can be relaxed.

At this point, "N concentration/Al concentration" is 0.995, and the number of carriers is almost the same as that in a case where co-doping is not performed. Since 100% of the carriers of $1\times10^{18}$ cm$^3$ or higher, which is 0.5% of $2\times10^{20}$ cm$^{-3}$, are free carriers, the sheet resistance to be achieved with conventional Al doping can be realized. Accordingly, the sheet resistance is almost the same as that in a case where co-doping is not performed. In a case where "N concentration/Al concentration" is 0.33 or where "Al concentration:N concentration" is 3:1, all carrier holes are received not by shallow acceptor levels formed with trimers but by deep acceptor levels formed with extra Al. Accordingly, the sheet resistance is almost the same as that in a case where co-doping is not performed. Therefore, a resistance lowering effect is achieved by co-doping in cases where "N concentration/Al concentration" is higher than 0.33 but lower than 0.995, or where N is implanted at 33 to 99.5% with respect to Al. With the margin of error being taken into account, it can be considered that the ratio of Al to N should be higher than 33% but lower than 100%.

When co-doping is not performed, a low-resistance SiC semiconductor material containing impurities having low concentrations of $1 \times 10^{18}$ cm$^{-3}$ or lower cannot exist. However, when trimers are formed by co-doping, shallow levels are formed, and the number of carriers increases. Accordingly, a reduction in resistance can be achieved with small amounts of impurities.

Co-doping with the p-type impurity and the n-type impurity at an appropriate ratio as described above can achieve at least two notable effects.

First, strain is relaxed, and SiC with less strain can be formed. Compared with a case where co-doping is not performed, strain is smaller, the number of defects is smaller, and larger amounts of impurities can be implanted. That is, the solid solubility limits of impurities can be raised. Accordingly, the sheet resistance, the resistivity, and the contact resistance are lowered. As fewer defects are formed by either ion implantation or epitaxial growth, dosing of large amounts of impurities can be performed.

Secondly, shallow levels can be formed. Compared with a case where co-doping is not performed, a low-resistance material can be formed with smaller amounts of impurities. Alternatively, a sheet resistance that is one or more digits lower can be achieved with the same amounts of impurities as those in a case where co-doping is not performed. In a region that can be formed through epitaxial growth and contains a low-dose impurity, the resistance becomes higher unless co-doping is performed. However, low-resistance SiC can be formed when co-doping is performed. Accordingly, an SiC semiconductor device having a lower ON resistance can be manufactured.

Next, a method of manufacturing the SiC epitaxial wafer of this embodiment is described. First, a manufacturing apparatus to be used in the method of manufacturing the SiC epitaxial wafer of this embodiment is described.

Figure 9:
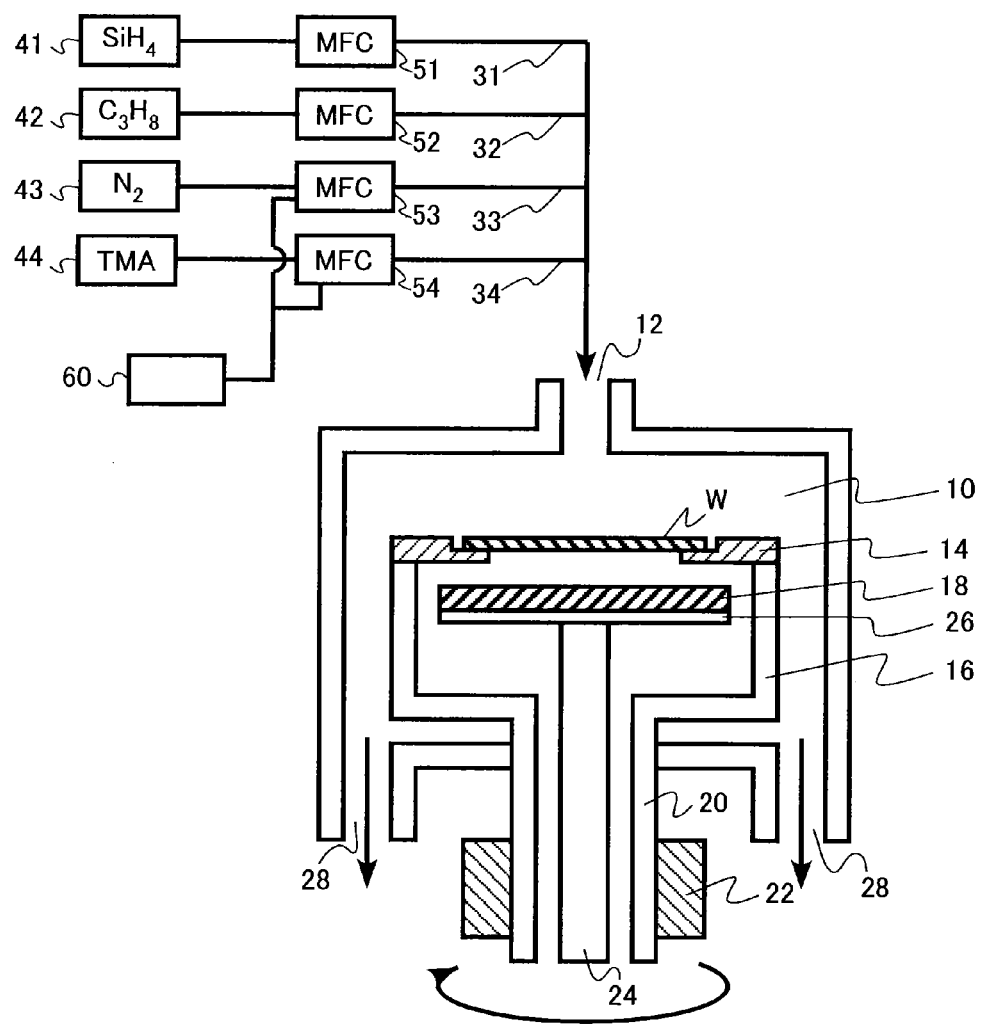
FIG. 9 is a schematic cross-sectional view of a vapor phase growth apparatus of the first embodiment.

FIG. 9 is a schematic cross-sectional view of a vapor phase growth apparatus of this embodiment. The vapor phase growth apparatus of this embodiment is a single-wafer processing epitaxial growth apparatus.

As shown in FIG. 9, the epitaxial growth apparatus of this embodiment includes a cylindrical, hollow reaction chamber 10 that is made of stainless steel, for example. A gas supply unit 12 is placed on the reaction chamber 10, and supplies process gases such as source gases into the reaction chamber 10.

A supporting unit 14 is placed below the gas supply unit 12 in the reaction chamber 10, and is capable of having a semiconductor wafer (a substrate) W placed thereon. The supporting unit 14 may be a ring-like holder that has an opening at the center, or may be a susceptor in contact with almost the entire bottom face of the semiconductor wafer W, for example.

A rotator unit 16 that has the supporting unit 14 placed on the upper surface thereof and rotates is also placed under the supporting unit 14. Further, a heater as a heating unit 18 that heats the wafer W on the supporting unit 14 with radiation heat is placed below the supporting unit 14.

Here, the rotator unit 16 has its rotating shaft 20 connected to a rotating drive mechanism 22 located at a lower portion thereof. The rotating drive mechanism 22 can rotate the semiconductor wafer W about the rotation center thereof at a high speed of 300 to 1000 rpm, for example.

The cylindrical rotating shaft 20 is also connected to a vacuum pump (not shown) for evacuating the hollow rotator unit 16. The semiconductor wafer W may be in vacuum contact with the supporting unit 14 by virtue of the suction force of the vacuum pump. The rotating shaft 20 is rotatably provided at a bottom portion of the reaction chamber 10 via a vacuum sealing member.

The heating unit 18 is fixed onto a support table 26 that is fixed to a support shaft 24 penetrating through the inside of the rotating shaft 20. A push-up pin (not shown) for detaching the semiconductor wafer W from the ring-like holder 14 may be provided in this support table 26.

Further, a gas emission unit 28 that discharges the reaction product generated after a source gas reaction in the surface or the like of the semiconductor wafer W and the residual gas in the reaction chamber 10 out of the reaction chamber 10 is provided at a bottom portion of the reaction chamber 10. The gas emission unit 28 is connected to the vacuum pump (not shown).

The epitaxial growth apparatus of this embodiment further includes a first gas supply channel 31 that supplies a Si (silicon) source gas to the reaction chamber 10, a second gas supply channel 32 that supplies a C (carbon) source gas to the reaction chamber 10, a third gas supply channel 33 that supplies an N (nitrogen) source gas to the reaction chamber 10, and a fourth gas supply channel 34 that supplies an Al (aluminum) source gas to the reaction chamber 10.

The first gas supply channel 31 is connected to a first gas supply source 41, the second gas supply channel 32 is connected to a second gas supply source 42, the third gas supply channel 33 is connected to a third gas supply source 43, and the fourth gas supply channel 34 is connected to a fourth gas supply source 44. The first through fourth gas supply sources 41 through 44 are gas cylinders or containers filled with the respective source gases, for example.

The Si (silicon) source gas may be monosilane ($SiH_4$) having a hydrogen gas ($H_2$) as the carrier gas, for example. The C (carbon) source gas may be propane ($C_3H_8$) having a hydrogen gas as the carrier gas, for example. The N (nitrogen) source gas may be a nitrogen gas ($N_2$), for example. The Al (aluminum) source gas may be trimethylaluminum (TMA) that is bubbled with a hydrogen gas ($H_2$) and has the hydrogen gas ($H_2$) as the carrier gas, for example.

The vapor phase growth apparatus of this embodiment further includes: a mass flow controller 51 that is connected to the first gas supply source 41 and adjusts the flow rate of the Si (silicon) source gas; a mass flow controller 52 that is connected to the second gas supply source 42 and adjusts the flow rate of the C (carbon) source gas; a mass flow controller (a first adjusting unit) 53 that is connected to the third gas supply source 43 and adjusts the flow rate of the N (nitrogen) source gas; and a mass flow controller (a second adjusting unit) 54 that is connected to the fourth gas supply source 44 and adjusts the flow rate of the Al (aluminum) source gas.

The vapor phase growth apparatus 100 also includes a control signal generating unit 60 that generates control signals that set flow rates in the first adjusting unit 53 and the second adjusting unit 54. The first adjusting unit 53 and the second adjusting unit 54, and the control signal generating unit 60 constitute the control unit that adjusts the flow rates of the N source gas and the Al source gas to desired flow rates.

The control signal generating unit 60 may be a computer that has the function to calculate such flow rates of the N source gas and the Al source gas that realize a desired concentration ratio between N and Al in the SiC film, for example. The control signal generating unit 60 generates control signals by calculating the flow rates required for the N source gas and the Al source gas based on the concentration ratio between N and Al in SiC that is input from an external input device and is to be realized.

In the control unit, the first adjusting unit 53 and the second adjusting unit 54 may have the above described function of the control signal generating unit 60.

With the vapor phase growth apparatus of this embodiment, an SiC film can be formed by simultaneously supplying an N (nitrogen) source gas as the n-type impurity and an Al (aluminum) source gas as the p-type impurity. Accordingly, an epitaxial SiC film co-doped with N (nitrogen) as the n-type impurity and Al (aluminum) as the p-type impurity can be formed.

Further, with the control unit that adjusts the flow rates of the N source gas and the Al source gas, the flow rates of the N source gas and the Al source gas can be adjusted to desired flow rates. Accordingly, the ratio between the Al concentration and the N concentration in the SiC being grown can be adjusted to a desired ratio.

Low-resistance SiC can be realized by co-doping SiC with N (nitrogen) as the n-type impurity and Al (aluminum) as the p-type impurity at a predetermined ratio as described above.

Particularly, the control unit is preferably designed to adjust the flow rates of the Al source gas and the N source gas so that the ratio of the N concentration to the Al concentration in the SiC being grown becomes higher than 0.33 but lower than 1.0, or the ratio of the Al concentration to the N concentration in the SiC being grown becomes higher than 0.40 but lower than 0.95.

Next, the method of manufacturing the SiC epitaxial wafer of this embodiment using the vapor phase growth apparatus is described, with reference to FIG. 9.

According to the SiC epitaxial wafer manufacturing method of this embodiment, a Si (silicon) source gas, a C (carbon) source gas, an n-type impurity source gas, and a p-type impurity source gas are simultaneously supplied into an SiC substrate in the reaction chamber, to grow p-type SiC. Where the p-type impurity is an element A and the n-type impurity is an element D, the element A and the element D are a combination of Al (aluminum), Ga (gallium), or In (indium) and N (nitrogen), and/or a combination of B (boron) and P (phosphorus). The amounts (flow rates) of the p-type impurity source gas and the n-type impurity source gas are controlled so that the ratio of the concentration of the element D to the concentration of the element A in the combination(s) in the p-type SiC being grown becomes higher than 0.33 but lower than 1.0.

The concentration of the element A in the p-type SiC epitaxial layer to be formed by the manufacturing method of this embodiment is not lower than $1\times10^{15}$ cm$^{-3}$ and not higher than $1\times10^{22}$ cm$^{-3}$, for example.

In the case of the first combination of Al (aluminum), Ga (gallium), or In (indium) and N (nitrogen), for example, the element A may be a single element selected from Al (aluminum), Ga (gallium), and In (indium). Alternatively, the element A may be formed with two elements such as Al (an element $A_1$) and Ga (an element $A_2$) or may be formed with three elements such as Al (the element $A_1$), Ga (the element $A_2$), and In (an element $A_3$). In a case where the element A is formed with more than one element, the element A may be formed with two or three kinds of elements, as long as the above described conditions on the ratio of the concentration of the element D to the concentration of the element A and on the concentration of the element A are satisfied.

The first combination and the second combination can coexist. However, the above described conditions on the ratio of the concentration of the element D to the concentration of the element A and on the concentration of the element A should be satisfied with elements that form at least one of the first and second combinations. In other words, each of the first combination and the second combination should satisfy the conditions on the element ratio and the element concentration. This is because trimers are not formed between an impurity in the first combination and an impurity in the second combination.

In the following, an example case where the element A is Al (aluminum) and the element D is N (nitrogen) is described.

First, an SiC substrate W is placed on the supporting unit 14 in the reaction chamber 10. The SiC substrate W is an n$^+$-type SiC substrate that contains P (phosphorus) or N (nitrogen) as the n-type impurity at an impurity concentration of approximately $5\times10^{18}$ cm$^{-3}$, for example, has a thickness of 300 µm, for example, and has a low resistance of 4H—SiC.

Here, the gate valve (not shown) of the wafer entrance of the reaction chamber 10 is opened, and the SiC substrate W in a load lock chamber is transported into the reaction chamber 10 with a handling arm. The SiC substrate W is then placed on the supporting unit 14 via the push-up pin (not shown), for example, the handling arm is retracted into the load lock chamber, and the gate valve is closed.

The vacuum pump (not shown) is then activated, to discharge the gas in the reaction chamber 10 through the gas emission unit 28 and adjust the inside of the reaction chamber 10 to a predetermined degree of vacuum. Here, the SiC substrate W placed on the supporting unit 14 is preheated to a predetermined temperature by the heating unit 18. Further, the heating power of the heating unit 18 is increased, and the semiconductor wafer W is heated to an SiC epitaxial growth temperature. The growth temperature is 1600 to 1750° C., for example.

The evacuation with the vacuum pump is continued, and the rotator unit 16 is rotated at a required speed. The Si (silicon), C (carbon), N (nitrogen), and Al (aluminum) source gases that are supplied from the first through fourth gas supply sources 41 through 44 and have flow rates adjusted by the mass flow controllers 51 through 52 are mixed, and are then injected through the gas supply unit 12. The source gases may be injected into the reaction chamber 10 through different nozzles from one another, for example, and may be mixed in the reaction chamber 10.

The Si (silicon) source gas may be monosilane ($SiH_4$) having a hydrogen gas ($H_2$) as the carrier gas, for example. The C (carbon) source gas may be propane ($C_3H_8$) having a hydrogen gas as the carrier gas, for example. The N (nitrogen) source gas may be a nitrogen gas ($N_2$) diluted with a hydrogen gas, for example. The Al (aluminum) source gas may be trimethylaluminum (TMA) that is bubbled with a hydrogen gas ($H_2$) and has the hydrogen gas ($H_2$) as the carrier gas, for example.

When the source gases are supplied, the control signal generating unit 60 generates control signals defining such flow rates that the ratio of the N concentration to the Al concentration (N concentration/Al concentration) in the p-type SiC being grown becomes higher than 0.33 but lower than 1.0.

The mixed gas of the Si (silicon), C (carbon), N (nitrogen), and Al (aluminum) source gases injected through the gas supply unit 12 is supplied in a rectified state onto the SiC substrate W. As a result, a p-type SiC single-crystal film is formed on the surface of the SiC substrate W through epitaxial growth.

When the epitaxial growth ends, the source gas injection through the gas supply unit 12 is stopped, the supply of the source gases onto the SiC substrate W is shut off, and the growth of the single-crystal film is ended.

After the film formation, the temperature of the semiconductor wafer W starts dropping. Here, the rotation of the rotator unit 16 is stopped, and the SiC substrate W having the single-crystal film formed thereon is left on the supporting unit 14. The heating power of the heating unit 18 is then returned to the initial value, and is adjusted to the preheating temperature of 600° C. or lower, for example.

After the temperature of the SiC substrate W is stabilized at a predetermined temperature, the SiC substrate W is detached from the supporting unit 14 with the push-up pin, for example. The gate valve is again opened, the handling arm is inserted, and the SiC substrate W is placed on the handling arm. The handling arm having the SiC substrate W placed thereon is then returned into the load lock chamber.

One film forming operation on the semiconductor wafer W is completed in the above described manner, and film formation may be continued on another SiC substrate W in the same process sequence as above, for example.

The concentration of Al (aluminum) in p-type SiC to be formed by the manufacturing method of this embodiment is not lower than $1 \times 10^{15}$ cm$^{-3}$ and not higher than $1 \times 10^{22}$ cm$^{-3}$, for example. According to the vapor phase growth method of this embodiment, co-doping is performed with N and Al at a predetermined ratio. As a result, the solid solubility limit of Al is raised, acceptor levels become shallower, and low-resistance p-type SiC is realized. Further, generation of defects is restrained, and high-quality p-type SiC is realized.

In this embodiment, p-type SiC is grown from a vapor phase. As diffusion in a vapor phase is much larger than that in a solid phase, interaction between N and Al occurs more easily than in a solid phase. As a result, trimer formation in SiC is facilitated. Accordingly, the effects of co-doping can be more easily achieved.

Particularly, in this embodiment, the effects of co-doping can be easily achieved by co-doping through ion implantation, even when the concentration of Al is in a relatively low-concentration range in which trimer formation is difficult, or even when the Al concentration is not lower than $1 \times 10^{15}$ cm$^{-3}$ and not higher than $1 \times 10^{18}$ cm$^{-3}$.

More particularly, when the Al concentration is within a low-concentration range of $1 \times 10^{15}$ to $1 \times 10^{18}$ cm$^{-3}$, acceptor levels can be made shallower. Accordingly, a reduction in resistance can be easily realized while the withstand voltage of SiC is maintained, compared with a case where co-doping is not performed and acceptor levels are deep.

So as to form p-type SiC having a lower resistance, the flow rates of the Al source gas and the N source gas are preferably adjusted so that the ratio of the N concentration to the Al concentration in the p-type SiC being grown becomes not lower than 0.40 and not higher than 0.95. Further, the flow rates of the Al source gas and the N source gas are preferably adjusted so that the ratio of the N concentration to the Al concentration becomes not lower than 0.45 and not higher than 0.75. More preferably, the flow rates of the Al source gas and the N source gas are adjusted so that the ratio of the N concentration to the Al concentration becomes not lower than 0.47 and not higher than 0.60.

Although the above described SiC substrate is an n$^+$-type substrate in this embodiment, the SiC substrate is not necessarily an n$^+$-type substrate. It is possible to use an n-type substrate, an n$^-$-type substrate, a p$^+$-type substrate, a p-type substrate, or a p$^-$-type substrate.

Although this embodiment is a simple structure having the single p-type SiC epitaxial layer 102 formed on the SiC substrate 100 as described above, one or more p- or n-type SiC epitaxial layers may be interposed between the SiC substrate 100 and the p-type SiC epitaxial layer 102, or one or more p- or n-type epitaxial layers may be formed on the p-type SiC epitaxial layer 102.

(Second Embodiment)

An SiC epitaxial wafer of this embodiment further includes: an n-type second SiC epitaxial layer formed between the SiC substrate and the p-type first SiC epitaxial layer; and a p-type third SiC epitaxial layer that is formed between the n-type second SiC epitaxial layer and the first SiC epitaxial layer, and has a lower p-type impurity concentration than the first SiC epitaxial layer. The SiC substrate is of the n-type, and the concentration of the n-type impurity in the SiC substrate is higher than that in the second SiC epitaxial layer. The concentration of the element A in the p-type first SiC epitaxial layer is not lower than $1 \times 10^{18}$ cm$^{-3}$ and not higher than $1 \times 10^{22}$ cm$^{-3}$. Except for the above aspects, this embodiment is the same as the first embodiment. Therefore, the same explanations as those in the first embodiment will not be repeated.

Figure 10:
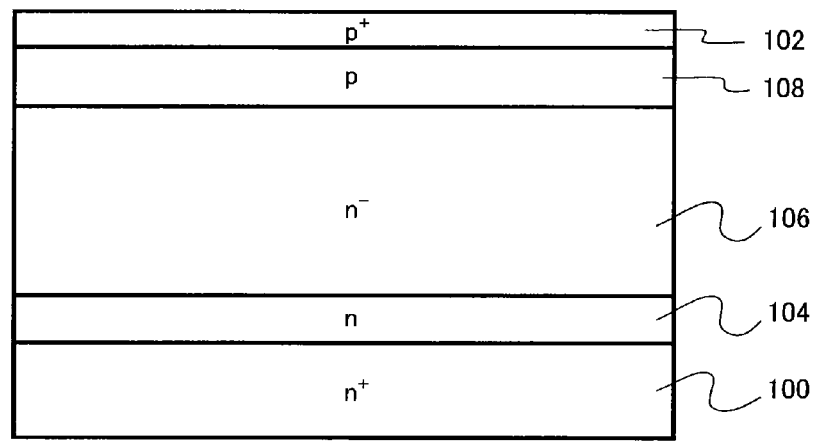
FIG. 10 is a schematic cross-sectional view of an SiC epitaxial wafer of a second embodiment.

FIG. 10 is a schematic cross-sectional view of the SiC epitaxial wafer of this embodiment. The SiC epitaxial wafer of this embodiment is an SiC epitaxial wafer for manufacturing PiN diodes, for example.

The SiC epitaxial wafer of this embodiment has a structure in which an n-type SiC epitaxial layer 104, an n$^-$-type SiC epitaxial layer (the second SiC epitaxial layer) 106, a p-type SiC epitaxial layer (the third SiC epitaxial layer) 108, and a p$^+$-type SiC epitaxial layer (the first SiC epitaxial layer) 102 are stacked on an n$^+$-type SiC substrate 100.

The n$^+$-type SiC substrate 100 is a 4H—SiC substrate that contains N (nitrogen) as the n-type impurity, for example, and has an impurity concentration of $5 \times 10^{17}$ to $5 \times 10^{19}$ cm$^{-3}$. The surface thereof is a face inclined at 0.2 to 10 degrees to the (0001) plane, for example. The impurity concentration in the SiC substrate 100 is higher than the impurity concentration in the n$^-$-type SiC epitaxial layer (the second SiC epitaxial layer) 106.

In a case where the n$^+$-type SiC substrate 100 contains a p-type impurity and an n-type impurity, and the p-type impurity is an element A while the n-type impurity is an element D, the element A and the element D are a combination of Al (aluminum), Ga (gallium), or In (indium) and N (nitrogen), and/or a combination of B (boron) and P (phosphorus). The ratio of the concentration of the element A to the concentration of the element D in the combination(s) is preferably higher than 0.40 but lower than 0.95. With this arrangement, resistance becomes lower, and defects are reduced.

The n-type SiC epitaxial layer 104 is a buffer layer for relaxing strain between the n$^+$-type SiC substrate 100 and the n$^-$-type SiC epitaxial layer 106. The n-type SiC epitaxial layer 104 contains N (nitrogen) as the n-type impurity, for example, and has an impurity concentration of $5 \times 10^{17}$ to $5 \times 10^{18}$ cm$^{-3}$. The impurity concentration is lower than the impurity concentration in the n$^+$-type SiC substrate 100, and is higher than the impurity concentration in the n$^-$-type SiC epitaxial layer (the second SiC epitaxial layer) 106. The N concentration may be a constant value within the above range, or may exhibit a concentration gradient within the above range.

In a case where the n-type SiC epitaxial layer 104 contains a p-type impurity and an n-type impurity, and the p-type impurity is an element A while the n-type impurity is an element D, the element A and the element D are a combination of Al (aluminum), Ga (gallium), or In (indium) and N (nitrogen), and/or a combination of B (boron) and P (phosphorus). The ratio of the concentration of the element A to the concentration of the element D in the combination(s) is preferably higher than 0.40 but lower than 0.95. With this arrangement, resistance becomes lower, and defects are reduced. By virtue of the pinning effect of trimers formed in the n-type SiC epitaxial layer 104, the BPDs (Basial Plane Defects) in the n-type SiC epitaxial layer 104 are prevented from expanding into the n⁻-type SiC epitaxial layer 106. Accordingly, a semiconductor device with excellent characteristics can be manufactured.

The n⁻-type SiC epitaxial layer (the second SiC epitaxial layer) 106 contains N (nitrogen) as the n-type impurity, for example, and has an impurity concentration that is not lower than $1\times10^{15}$ cm$^{-3}$ and not higher than $5\times10^{16}$ cm$^{-3}$. The N concentration may be a constant value within the above range, or may exhibit a concentration gradient within the above range.

In a case where the n⁻-type SiC epitaxial layer 106 contains a p-type impurity and an n-type impurity, and the p-type impurity is an element A while the n-type impurity is an element D, the element A and the element D are a combination of Al (aluminum), Ga (gallium), or In (indium) and N (nitrogen), and/or a combination of B (boron) and P (phosphorus). The ratio of the concentration of the element A to the concentration of the element D in the combination(s) is preferably higher than 0.40 but lower than 0.95. With this arrangement, resistance becomes lower, and defects are reduced.

The p-type SiC epitaxial layer (the third SiC epitaxial layer) 108 contains Al (aluminum) as the p-type impurity, for example, and has an impurity concentration that is not lower than $1\times10^{16}$ cm$^{-3}$ and not higher than $1\times10^{18}$ cm$^{-3}$. The impurity concentration in the p-type SiC epitaxial layer 108 is lower than that in the p⁺-type SiC epitaxial layer (the first SiC epitaxial layer) 102.

In a case where the p-type SiC epitaxial layer 108 contains a p-type impurity and an n-type impurity, and the p-type impurity is an element A while the n-type impurity is an element D, the element A and the element D are a combination of Al (aluminum), Ga (gallium), or In (indium) and N (nitrogen), and/or a combination of B (boron) and P (phosphorus). The ratio of the concentration of the element D to the concentration of the element A in the above combination(s) is preferably higher than 0.33 but lower than 1.0. With this arrangement, resistance becomes lower, and defects are reduced.

The p⁺-type SiC epitaxial layer (the first SiC epitaxial layer) 102 contains Al (aluminum) as the p-type impurity, for example, and has an impurity concentration that is not lower than $1\times10^{18}$ cm$^{-3}$ and not higher than $1\times10^{22}$ cm$^{-3}$. So as to lower resistance, the impurity concentration is preferably not lower than $1\times10^{19}$ cm$^{-3}$ and not higher than $1\times10^{22}$ cm$^{-3}$, or more preferably, not lower than $1\times10^{20}$ cm$^{-3}$ and not higher than $1\times10^{22}$ cm$^{-3}$. The Al concentration may be a constant value within the above range, or may exhibit a concentration gradient within the above range.

In a case where the p⁺-type SiC epitaxial layer 102 contains a p-type impurity and an n-type impurity, and the p-type impurity is an element A while the n-type impurity is an element D, the element A and the element D are a combination of Al (aluminum), Ga (gallium), or In (indium) and N (nitrogen), and/or a combination of B (boron) and P (phosphorus). The ratio of the concentration of the element D to the concentration of the element A in the above combination(s) is higher than 0.33 but lower than 1.0.

The concentration of the element A in the p⁺-type SiC epitaxial layer 102 is not lower than $1\times10^{18}$ cm$^{-3}$ and not higher than $1\times10^{22}$ cm$^{-3}$. So as to lower resistance, the concentration of the element A is preferably not lower than $1\times10^{19}$ cm$^{-3}$ and not higher than $1\times10^{22}$ cm$^{-3}$, or more preferably, not lower than $1\times10^{20}$ cm$^{-3}$ and not higher than $1\times10^{22}$ cm$^{-3}$. The concentration of the element A may be a constant value within the above range, or may exhibit a concentration gradient within the above range.

So as to lower resistance, the ratio of the concentration of the element D to the concentration of the element A in the p⁺-type SiC epitaxial layer 102 is preferably higher than 0.40 but lower than 0.95, the acceptor levels of the element A are preferably 150 meV or lower, and 90% or more of the element D is preferably located in the lattice site location nearest to the element A.

In the SiC epitaxial wafer of this embodiment, the resistance of the SiC epitaxial wafer is low, and the number of defects is small. Accordingly, by using the SiC epitaxial wafer of this embodiment, a high-performance semiconductor device with excellent reliability can be manufactured.

(Third Embodiment)

A semiconductor device of this embodiment includes: an n-type first SiC epitaxial layer; a p-type second SiC epitaxial layer that is formed on the first SiC epitaxial layer, and contains a p-type impurity and an n-type impurity, an element A and an element D being a combination of Al (aluminum), Ga (gallium), or In (indium) and N (nitrogen), and/or a combination of B (boron) and P (phosphorus) when the p-type impurity is the element A and the n-type impurity is the element D. In other words, when the p-type impurity is an element A and the n-type impurity is an element D, the element A and the element D form at least a first combination or a second combination, the first combination being a combination of the element A selected from a group consisting of Al (aluminum), Ga (gallium), and In (indium) and the element D being N (nitrogen), the second combination being a combination of the element A being B (boron) and the element D being P (phosphorus). The ratio of the concentration of the element D to the concentration of the element A in the combination(s) is higher than 0.33 but lower than 1.0, the concentration of the element A in the combination(s) is not lower than $1\times10^{18}$ cm$^{3}$ and not higher than $1\times10^{22}$ cm$^{-3}$. The device includes a first electrode formed on the second SiC epitaxial layer; a second electrode formed on the opposite side of the first SiC epitaxial layer from the first electrode; and groove portions formed on both sides of the first electrode, and extend from the surface of the second SiC epitaxial layer into the first SiC epitaxial layer.

The semiconductor device of this embodiment is a mesa-type PiN diode. The PiN diode of this embodiment is manufactured by using the SiC epitaxial wafer of the second embodiment, for example. Part of explanation of the same aspects as those of the second embodiment will not be repeated.

Figure 11:
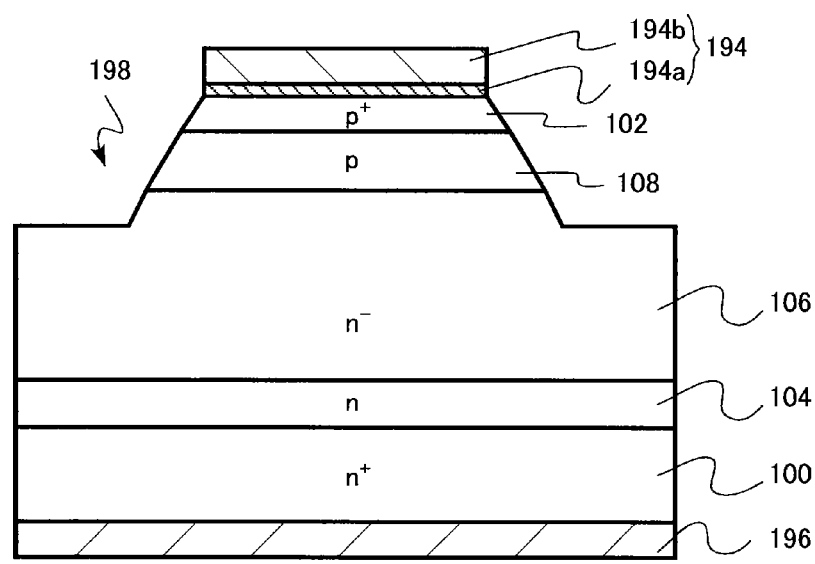
FIG. 11 is a schematic cross-sectional view of a semiconductor device of a third embodiment.

FIG. 11 is a schematic cross-sectional view of the semiconductor device of this embodiment.

This PiN diode includes an n⁺-type SiC substrate (a silicon carbide substrate) 100 having first and second faces. In FIG. 11, the first face is the upper face, and the second face is the lower face.

The SiC substrate 100 is a 4H—SiC substrate that contains N (nitrogen) as the n-type impurity, for example, and has an impurity concentration of $5\times10^{17}$ to $5\times10^{19}$ cm$^{-3}$. The first face is a face inclined at 0.2 to 10 degrees to the (0001) plane, for example.

An n-type SiC epitaxial layer 104 is formed on the first face of the SiC substrate 100. The n-type SiC epitaxial layer 104 is a buffer layer for relaxing strain between the n⁺-type SiC substrate 100 and an n⁻-type SiC epitaxial layer 106.

The n-type SiC epitaxial layer 104 contains N (nitrogen) as the n-type impurity, for example, and has an impurity concentration of $5 \times 10^{17}$ to $5 \times 10^{18}$ cm$^{-3}$. The film thickness of the n-type SiC epitaxial layer 104 is approximately 0.5 to 10 μm, for example.

The n-type SiC epitaxial layer 104 is preferably co-doped with Al (aluminum) and N (nitrogen). The ratio of the Al concentration to the N concentration is preferably higher than 0.40 but lower than 0.95.

The n⁻-type SiC epitaxial layer (the first SiC epitaxial layer) 106 is formed on the n-type SiC epitaxial layer 104. The n⁻-type SiC epitaxial layer 106 contains N (nitrogen) as the n-type impurity, for example, and has an impurity concentration that is not lower than $1 \times 10^{15}$ cm$^{-3}$ and not higher than $5 \times 10^{16}$ cm$^{-3}$. The film thickness of the n⁻-type SiC epitaxial layer 106 is approximately 5 to 100 μm, for example.

The n⁻-type SiC epitaxial layer 106 is preferably co-doped with Al (aluminum) and N (nitrogen). The ratio of the Al concentration to the N concentration is preferably higher than 0.40 but lower than 0.95.

The p-type SiC epitaxial layer (the third SiC epitaxial layer) 108 is formed on the n⁻-type SiC epitaxial layer 106. The p-type SiC epitaxial layer 108 contains Al (aluminum) as the p-type impurity, for example, and has an impurity concentration that is not lower than $1 \times 10^{16}$ cm$^{-3}$ and not higher than $1 \times 10^{18}$ cm$^{-3}$. The film thickness of the p-type SiC epitaxial layer 108 is approximately 0.2 to 3 μm, for example.

The p-type SiC epitaxial layer 108 is preferably co-doped with Al (aluminum) and N (nitrogen). The ratio of the N concentration to the Al concentration is preferably higher than 0.33 but lower than 1.0.

The p⁺-type SiC epitaxial layer (the second SiC epitaxial layer) 102 is formed on the p-type SiC epitaxial layer 108. The p⁺-type SiC epitaxial layer 102 contains Al (aluminum) as the p-type impurity, for example, and has an impurity concentration that is not lower than $1 \times 10^{18}$ cm$^{-3}$ and not higher than $1 \times 10^{22}$ cm$^{-3}$. So as to lower resistance, the impurity concentration is preferably not lower than $1 \times 10^{19}$ cm$^{-3}$ and not higher than $1 \times 10^{22}$ cm$^{-3}$, or more preferably, not lower than $1 \times 10^{20}$ cm$^{-3}$ and not higher than $1 \times 10^{22}$ cm$^{-3}$. The Al concentration may be a constant value within the above range, or may exhibit a concentration gradient within the above range.

In a case where the p⁺-type SiC epitaxial layer 102 contains a p-type impurity and an n-type impurity, and the p-type impurity is an element A while the n-type impurity is an element D, the element A and the element D are a combination of Al (aluminum), Ga (gallium), or In (indium) and N (nitrogen), and/or a combination of B (boron) and P (phosphorus). The ratio of the concentration of the element D to the concentration of the element A in the above combination(s) is higher than 0.33 but lower than 1.0.

The concentration of the element A in the p⁺-type SiC epitaxial layer 102 is not lower than $1 \times 10^{18}$ cm$^{-3}$ and not higher than $1 \times 10^{22}$ cm$^{-3}$. So as to lower the resistivity of the p⁺-type SiC epitaxial layer 102 and the contact resistance with an electrode, the concentration of the element is preferably not lower than $1 \times 10^{19}$ cm$^{-3}$ and not higher than $1 \times 10^{22}$ cm$^{-3}$, or more preferably, not lower than $1 \times 10^{20}$ cm$^{-3}$ and not higher than $1 \times 10^{22}$ cm$^{-3}$. The concentration of the element A may be a constant value within the above range, or may exhibit a concentration gradient within the above range.

The film thickness of the p⁺-type SiC epitaxial layer 102 is approximately 0.2 to 1 μm, for example.

A conductive anode electrode (the first electrode) 194 that is electrically connected to the p⁺-type SiC epitaxial layer 102 is provided. The anode electrode 194 is formed with an Ni (nickel) barrier metal layer 194a and an Al metal layer 194b formed on the barrier metal layer 194a, for example.

A conductive cathode electrode (the second electrode) 196 is formed on the second face side of the SiC substrate 100. The cathode electrode 196 is made of Ni, for example.

In the PiN diode, groove portions 198 are formed on both sides of the first electrode 194. The groove portions 198 extend from the surface of the second SiC epitaxial layer 102 into the first SiC epitaxial layer 106. The groove portions 198 are filled with oxide film (not shown), for example. By forming the groove portions 198, leakage current is reduced, and a high-voltage PiN diode is realized.

According to this embodiment, the p⁺-type SiC epitaxial layer 102 is a co-doped p-type impurity layer. As a result, a low resistance is realized. Also, the contact resistance between the p⁺-type SiC epitaxial layer 102 and the anode electrode (the first electrode) 194 is lowered. As a result, a PiN diode with a large forward current is realized.

Also, defects in the p⁺-type SiC epitaxial layer 102 are reduced, and a PiN diode that has a stable forward drop voltage (Vf) and a stable reverse breakdown withstand voltage is realized.

(Fourth Embodiment)

An SiC epitaxial wafer of this embodiment includes: an SiC substrate; and an n-type first SiC epitaxial layer that is formed on the SiC substrate and contains a p-type impurity and an n-type impurity, an element A and an element D being a combination of Al (aluminum), Ga (gallium), or In (indium) and N (nitrogen), and/or a combination of B (boron) and P (phosphorus) when the p-type impurity is the element A and the n-type impurity is the element D. In other words, when the p-type impurity is an element A and the n-type impurity is an element D, the element A and the element D format least a first combination or a second combination, the first combination being a combination of the element A selected from a group consisting of Al (aluminum), Ga (gallium), and In (indium) and the element D being N (nitrogen), the second combination being a combination of the element A being B (boron) and the element D being P (phosphorus). The ratio of the concentration of the element A to the concentration of the element D in the combination(s) is higher than 0.40 but lower than 0.95.

Figure 12:
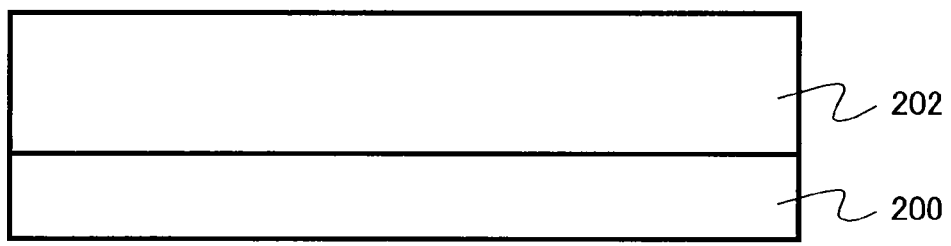
FIG. 12 is a schematic cross-sectional view of an SiC epitaxial wafer of a fourth embodiment.

FIG. 12 is a schematic cross-sectional view of the SiC epitaxial wafer of this embodiment. The SiC epitaxial wafer of this embodiment has an n-type SiC epitaxial layer (the first SiC epitaxial layer) 202 on an SiC substrate 200.

The SiC substrate 200 is an n⁺-type single-crystal SiC substrate, for example. The SiC substrate 200 is a 4H—SiC substrate having a surface inclined at an off-angle of 0.2 to 10 degrees to the (0001) plane. The n-type impurity is N (nitrogen), for example, and the impurity concentration is not lower than $5 \times 10^{17}$ cm$^{-3}$ and not higher than $5 \times 10^{19}$ cm$^{-3}$, for example.

The n-type SiC epitaxial layer (the first SiC epitaxial layer) 202 is formed through epitaxial growth. In a case where the n-type SiC epitaxial layer 202 contains a p-type impurity and an n-type impurity, and the p-type impurity is an element A while the n-type impurity is an element D, the element A and the element D are a combination of Al (aluminum), Ga (gallium), or In (indium) and N (nitrogen), and/or a combination of B (boron) and P (phosphorus). The ratio of the concentration of the element A to the concentration of the element D in the combination(s) is higher than 0.40 but lower than 0.95.

The n-type impurity concentration or the concentration of the element D in the n-type SiC epitaxial layer 202 is not lower than $1\times10^{15}$ cm$^{-3}$ and not higher than $5\times10^{16}$ cm$^{-3}$, for example.

The SiC epitaxial wafer of this embodiment realizes a low-resistance n-type SiC epitaxial layer with the above described structure. The function and effects of co-doping with an n-type impurity and a p-type impurity are the same as those in the first embodiment, and therefore, explanation of them is not repeated herein.

So as to lower resistance, the ratio of the concentration of the element A to the concentration of the element D in the n-type SiC epitaxial layer 202 is preferably not lower than 0.45 and not higher than 0.75, the donor levels of the element D are preferably 40 meV or lower, and 90% or more of the element A is preferably located in the lattice site location nearest to the element D.

Next, a method of manufacturing the SiC epitaxial wafer of this embodiment is described.

According to the SiC epitaxial wafer manufacturing method of this embodiment, a Si (silicon) source gas, a C (carbon) source gas, an n-type impurity source gas, and a p-type impurity source gas are simultaneously supplied into an SiC substrate in the reaction chamber, to grow p-type SiC. Where the p-type impurity is an element A and the n-type impurity is an element D, the element A and the element D are a combination of Al (aluminum), Ga (gallium), or In (indium) and N (nitrogen), and/or a combination of B (boron) and P (phosphorus). The amounts (flow rates) of the p-type impurity source gas and the n-type impurity source gas are controlled so that the ratio of the concentration of the element A to the concentration of the element D in the combination(s) in the p-type SiC being grown becomes higher than 0.40 but lower than 0.95.

The concentration of the element D in the n-type SiC epitaxial layer to be formed by the manufacturing method of this embodiment is not lower than $1\times10^{15}$ cm$^{-3}$ and not higher than $1\times10^{22}$ cm$^{-3}$, for example.

In the case of the first combination of Al (aluminum), Ga (gallium), or In (indium) and N (nitrogen), for example, the element A may be a single element selected from Al (aluminum), Ga (gallium), and In (indium). Alternatively, the element A may be formed with two elements such as Al (an element $A_1$) and Ga (an element $A_2$) or may be formed with three elements such as Al (the element $A_1$), Ga (the element $A_2$), and In (an element $A_3$). In a case where the element A is formed with more than one element, the element A may be formed with two or three kinds of elements, as long as the above described conditions on the ratio of the concentration of the element A to the concentration of the element D and on the concentration of the element D are satisfied.

The first combination and the second combination can coexist. However, the above described conditions on the ratio of the concentration of the element A to the concentration of the element D and on the concentration of the element D should be satisfied with elements that form at least one of the first and second combinations. In other words, each of the first combination and the second combination should satisfy the conditions on the element ratio and the element concentration. This is because the later described trimers are not formed between an impurity in the first combination and an impurity in the second combination.

In the following, an example case where the element A is Al (aluminum) and the element D is N (nitrogen) is described.

The method of manufacturing the SiC epitaxial wafer of this embodiment differs from the method of vapor phase growth of a p-type SiC epitaxial layer of the first embodiment in the flow rates of the N (nitrogen) source gas and the Al (aluminum) source gas. Explanation of the same aspects as those of the method of vapor phase growth of p-type SiC of the first embodiment will not be repeated.

When the source gases are supplied, the control signal generating unit 60 generates control signals defining such flow rates that the ratio of the Al concentration to the N concentration (Al concentration/N concentration) in the n-type SiC being grown becomes higher than 0.40 but lower than 0.95.

In the vapor phase growth of n-type SiC, the mixed gas of the Si (silicon), C (carbon), N (nitrogen), and Al (aluminum) source gases injected through the gas supply unit 12 is supplied in a rectified state onto an SiC substrate W. As a result, an n-type SiC single-crystal film is formed on the surface of the SiC substrate W through epitaxial growth.

The concentration of N (nitrogen) in n-type SiC to be formed by the vapor phase growth method of this embodiment is not lower than $1\times10^{15}$ cm$^{-3}$ and not higher than $1\times10^{22}$ cm$^{-3}$, for example. According to the manufacturing method of this embodiment, co-doping is performed with N and Al at a predetermined ratio. As a result, the solid solubility limit of Al is raised, acceptor levels become shallower, and low-resistance n-type SiC is realized. Further, generation of defects is restrained, and high-quality n-type SiC is realized.

In this embodiment, n-type SiC is grown from a vapor phase. As diffusion in a vapor phase is much larger than that in a solid phase, interaction between N and Al occurs more easily than in a solid phase. As a result, trimer formation in SiC is facilitated. Accordingly, the effects of co-doping can be more easily achieved.

Particularly, in this embodiment, the effects of co-doping can be easily achieved by co-doping through ion implantation, even when the concentration of N is in a relatively low-concentration range in which trimer formation is difficult, or when the N concentration is not lower than $1\times10^{15}$ cm$^{-3}$ and not higher than $1\times10^{18}$ cm$^{-3}$.

More particularly, when the N concentration is within a low-concentration range of $1\times10^{15}$ to $1\times10^{18}$ cm$^{-3}$, donor levels can be made shallower. Accordingly, a reduction in resistance can be easily realized while the withstand voltage of SiC is maintained, compared with a case where co-doping is not performed and donor levels are deep. In this manner, this embodiment can form an SiC film that is suitable as the drift layer of a vertical MOSFET (Metal Oxide Semiconductor Field Effect Transistor) or a vertical IGBT (Insulated Gate Bipolar Transistor).

So as to form n-type SiC having a lower resistance, the flow rates of the Al source gas and the N source gas are preferably adjusted so that the ratio of the Al concentration to the N concentration in the n-type SiC being grown becomes not lower than 0.45 and not higher than 0.75. More preferably, the flow rates of the Al source gas and the N source gas are adjusted so that the ratio of the Al concentration to the N concentration becomes not lower than 0.47 and not higher than 0.60.

Although the above described SIC substrate is an n$^+$-type substrate in this embodiment, the SiC substrate is not necessarily an n$^+$-type substrate. It is possible to use an n-type substrate, an n$^-$-type substrate, a p$^+$-type substrate, a p-type substrate, or a p$^-$-type substrate.

Although this embodiment is a simple structure having the single n-type SiC epitaxial layer 202 formed on the SiC substrate 200 as described above, one or more p- or n-type SiC epitaxial layers may be interposed between the SiC substrate 200 and the n-type SiC epitaxial layer 202, or one or more p- or n-type epitaxial layers may be formed on the n-type SiC epitaxial layer 202.

(Fifth Embodiment)

An SiC epitaxial wafer of this embodiment further includes an n-type second SiC epitaxial layer that is formed between the SiC substrate and the first SiC epitaxial layer, and contains a p-type impurity and an n-type impurity, an element A and an element D being a combination of Al (aluminum), Ga (gallium), or In (indium) and N (nitrogen), and/or a combination of B (boron) and P (phosphorus) when the p-type impurity is the element A and the n-type impurity is the element D, the ratio of the concentration of the element A to the concentration of the element D in the combination(s) being higher than 0.40 but lower than 0.95. The SiC substrate is of the n-type, and the concentration of the n-type impurity in the second SiC epitaxial layer is lower than that in the SiC substrate and is higher than that in the first SiC epitaxial layer. The concentration of the element D in the first SiC epitaxial layer is not lower than $1 \times 10^{15}$ cm$^{-3}$ and not higher than $5 \times 10^{16}$ cm$^{-3}$. Except for the above aspects, this embodiment is the same as the fourth embodiment. Therefore, the same explanations as those in the fourth embodiment will not be repeated.

Figure 13:
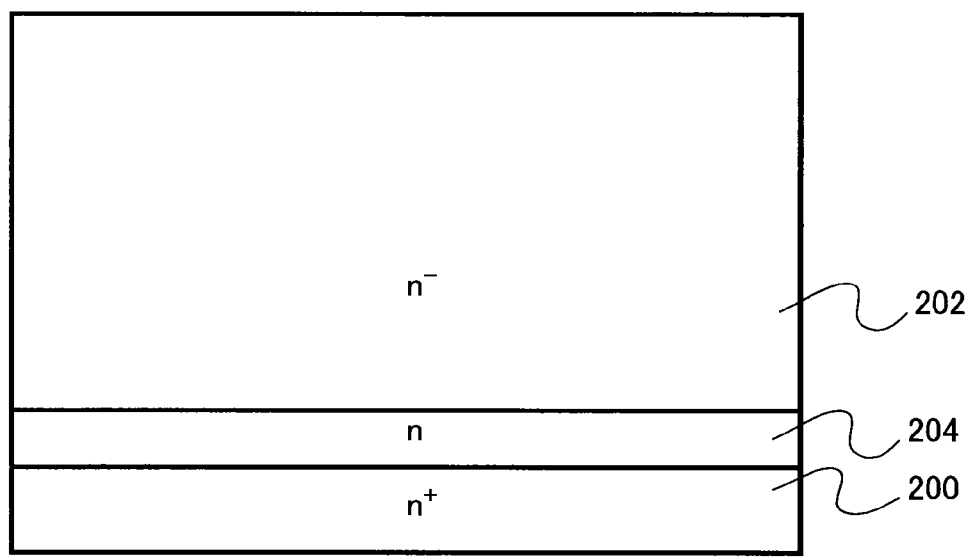
FIG. 13 is a schematic cross-sectional view of an SiC epitaxial wafer of a fifth embodiment.

FIG. 13 is a schematic cross-sectional view of the SiC epitaxial wafer of this embodiment. The SiC epitaxial wafer of this embodiment is an SiC epitaxial wafer for manufacturing vertical MOSFETs, for example.

The SiC epitaxial wafer of this embodiment has a structure in which an n-type SiC epitaxial layer (the second SiC epitaxial layer) 204 and an n$^-$-type SiC epitaxial layer (the first SiC epitaxial layer) 202 are stacked on an n$^+$-type SiC substrate 200.

The n$^+$-type SiC substrate 200 is a 4H—SiC substrate that contains N (nitrogen) as the n-type impurity, for example, and has an impurity concentration of $5 \times 10^{17}$ to $5 \times 10^{19}$ cm$^{-3}$. The surface thereof is a face inclined at 0.2 to 10 degrees to the (0001) plane, for example. The impurity concentration in the SiC substrate 200 is higher than the impurity concentration in the n$^-$-type SiC epitaxial layer (the first SiC epitaxial layer) 202.

The n-type SiC epitaxial layer (the second SiC epitaxial layer) 204 is a buffer layer for relaxing strain between the n$^+$-type SiC substrate 200 and the n$^-$-type SiC epitaxial layer 202. The n-type SiC epitaxial layer 204 contains N (nitrogen) as the n-type impurity, for example, and has an impurity concentration of $5 \times 10^{17}$ to $5 \times 10^{18}$ cm$^{-3}$. The impurity concentration is lower than the impurity concentration in the n$^+$-type SiC substrate 200, and is higher than the impurity concentration in the n$^-$-type SiC epitaxial layer (the first SiC epitaxial layer) 202. The film thickness of the n-type SiC epitaxial layer 204 is approximately 0.5 to 10 μm, for example.

In a case where the n-type SiC epitaxial layer 204 contains a p-type impurity and an n-type impurity, and the p-type impurity is an element A while the n-type impurity is an element D, the element A and the element D are a combination of Al (aluminum), Ga (gallium), or In (indium) and N (nitrogen), and/or a combination of B (boron) and P (phosphorus). The ratio of the concentration of the element A to the concentration of the element D in the combination (s) is higher than 0.40 but lower than 0.95. With this arrangement, resistance becomes lower, and defects are reduced. By virtue of the pinning effect of trimers formed in the n-type SiC epitaxial layer 204, the BPDs (Basial Plane Defects) in the n-type SiC epitaxial layer 204 are prevented from expanding into the n$^-$-type SiC epitaxial layer 202. Accordingly, a semiconductor device with excellent characteristics can be manufactured.

The n$^-$-type SiC epitaxial layer (the first SiC epitaxial layer) 202 contains N (nitrogen) as the n-type impurity, for example, and has an impurity concentration that is not lower than $1 \times 10^{15}$ cm$^{-3}$ and not higher than $5 \times 10^{16}$ cm$^{-3}$. The film thickness of the n$^-$-type SiC epitaxial layer (the first SiC epitaxial layer) 202 is approximately 5 to 50 μm, for example. The N concentration may be a constant value within the above range, or may exhibit a concentration gradient within the above range.

In a case where the n$^-$-type SiC epitaxial layer 202 contains a p-type impurity and an n-type impurity, and the p-type impurity is an element A while the n-type impurity is an element D, the element A and the element D are a combination of Al (aluminum), Ga (gallium), or In (indium) and N (nitrogen), and/or a combination of B (boron) and P (phosphorus). The ratio of the concentration of the element A to the concentration of the element D in the combination (s) is higher than 0.40 but lower than 0.95. With this arrangement, resistance becomes lower, and defects are reduced.

So as to lower resistance, the ratio of the concentration of the element A to the concentration of the element D in the n-type SiC epitaxial layer 202 is preferably not lower than 0.45 and not higher than 0.75, the donor levels of the element D are preferably 40 meV or lower, and 90% or more of the element A is preferably located in the lattice site location nearest to the element D.

In the SiC epitaxial wafer of this embodiment, the resistance of the SiC epitaxial wafers is low, and the number of defects is small. Accordingly, by using the SiC epitaxial wafer of this embodiment, a high-performance semiconductor device with excellent reliability can be manufactured.

(Sixth Embodiment)

A semiconductor device of this embodiment includes: an n-type first SiC epitaxial layer that contains a p-type impurity and an n-type impurity, an element A and an element D being a combination of Al (aluminum), Ga (gallium), or In (indium) and N (nitrogen), and/or a combination of B (boron) and P (phosphorus) when the p-type impurity is the element A and the n-type impurity is the element D. In other words, when the p-type impurity is an element A and the n-type impurity is an element D, the element A and the element D format least a first combination or a second combination, the first combination being a combination of the element A selected from a group consisting of Al (aluminum), Ga (gallium), and In (indium) and the element D being N (nitrogen), the second combination being a combination of the element A being B (boron) and the element D being P (phosphorus). The ratio of the concentration of the element A to the concentration of the element D in the combination(s) is higher than 0.40 but lower than 0.95. The device includes, a p-type first SiC region formed in the surface of the first SiC epitaxial layer; an n-type second SiC region formed in the surface of the first SiC region; a gate insulating film formed continuously in the surfaces of the first SiC epitaxial layer and the first SiC region; a gate electrode formed on the gate insulating film; a first electrode formed on the second SiC region; and a second electrode formed on the opposite side of the first SiC epitaxial layer from the first electrode.

The semiconductor device of this embodiment is a vertical MOSFET. The MOSFET of this embodiment is manufactured by using the SiC epitaxial wafer of the fifth embodiment. Part of explanation of the same aspects as those of the fifth embodiment will not be repeated.

Figure 14:
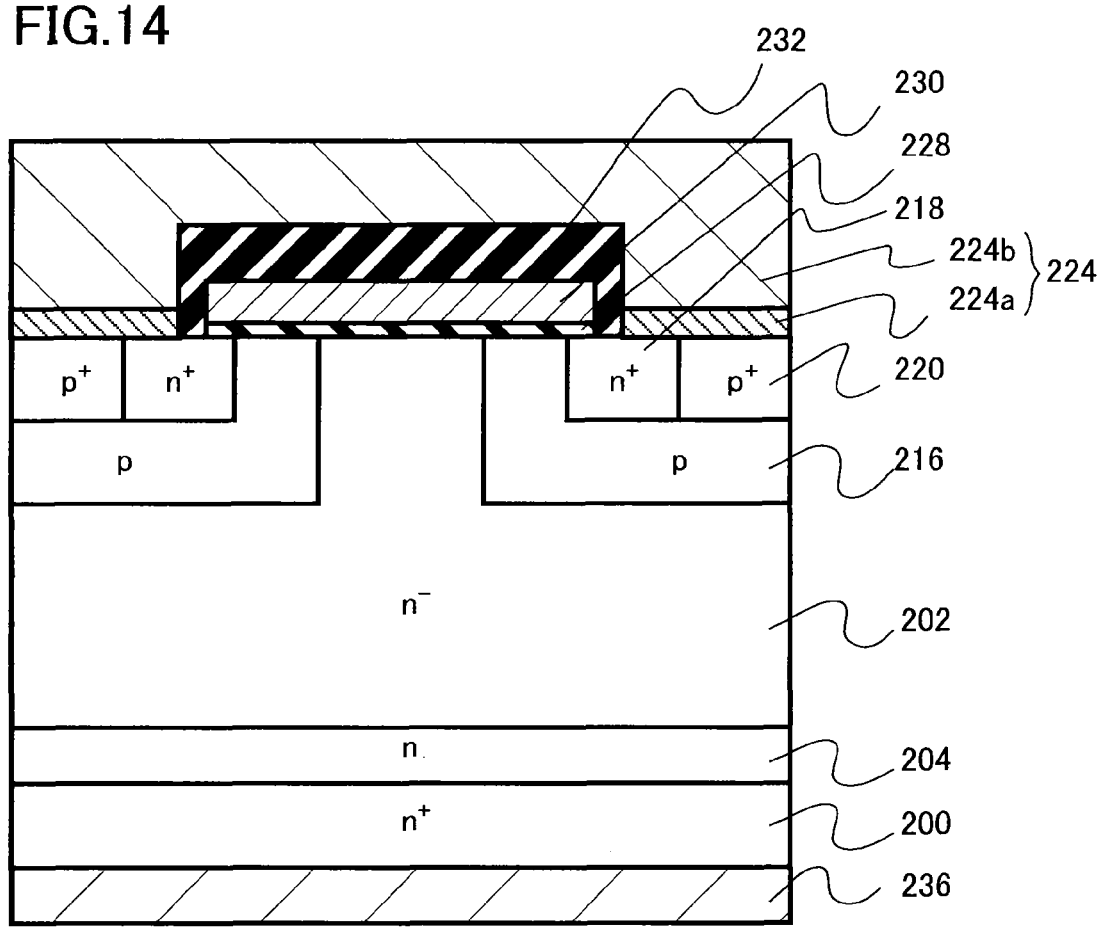
FIG. 14 is a schematic cross-sectional view of a semiconductor device of a sixth embodiment.

FIG. 14 is a schematic cross-sectional view of the semiconductor device of this embodiment. This MOSFET (Metal Oxide Semiconductor Field Effect Transistor) is a Double Implantation MOSFET (DIMOSFET) having a p-well and a source region formed through ion implantation, for example.

This MOSFET includes an SiC substrate (a silicon carbide substrate) 200 having first and second faces. In FIG. 14, the first face is the upper face, and the second face is the lower face.

The n$^+$-type SiC substrate 200 is a 4H—SiC substrate that contains N (nitrogen) as the n-type impurity, for example, and has an impurity concentration of $5\times10^{17}$ to $5\times10^{19}$ cm$^{-3}$. The surface thereof is a face inclined at 0.2 to 10 degrees to the (0001) plane, for example. The impurity concentration in the SiC substrate 200 is higher than the impurity concentration in an n$^-$-type SiC epitaxial layer (the first SiC epitaxial layer) 202.

An n-type SiC epitaxial layer (the second SiC epitaxial layer) 204 is formed on the first face of the SiC substrate 200. The n-type SiC epitaxial layer (the second SiC epitaxial layer) 204 is a buffer layer for relaxing strain between the n$^+$-type SiC substrate 200 and the n$^-$-type SiC epitaxial layer 202. The n-type SiC epitaxial layer 204 contains N (nitrogen) as the n-type impurity, for example, and has an impurity concentration of $5\times10^{17}$ to $5\times10^{18}$ cm$^{-3}$. The impurity concentration is lower than the impurity concentration in the n$^+$-type SiC substrate 200, and is higher than the impurity concentration in the n$^-$-type SiC epitaxial layer (the first SiC epitaxial layer) 202. The film thickness of the n-type SiC epitaxial layer 204 is approximately 0.5 to 10 μm, for example.

In a case where the n-type SiC epitaxial layer 204 contains a p-type impurity and an n-type impurity, and the p-type impurity is an element A while the n-type impurity is an element D, the element A and the element D are a combination of Al (aluminum), Ga (gallium), or In (indium) and N (nitrogen), and/or a combination of B (boron) and P (phosphorus). The ratio of the concentration of the element A to the concentration of the element D in the combination (s) is higher than 0.40 but lower than 0.95. With this arrangement, resistance becomes lower, and defects are reduced. By virtue of the pinning effect of trimers formed in the n-type SiC epitaxial layer 204, the BPDs (Basial Plane Defects) in the n-type SiC epitaxial layer 204 are prevented from expanding into the n$^-$-type SiC epitaxial layer 202. Accordingly, a semiconductor device with excellent characteristics can be manufactured.

The n$^-$-type SiC epitaxial layer (the first SiC epitaxial layer) 202 is formed on the n-type SiC epitaxial layer 204. The n$^-$-type SiC epitaxial layer (the first SiC epitaxial layer) 202 is a drift layer.

The n$^-$-type SiC epitaxial layer (the first SiC epitaxial layer) 202 contains N (nitrogen) as the n-type impurity, for example, and has an impurity concentration that is not lower than $1\times10^{15}$ cm$^{-3}$ and not higher than $5\times10^{16}$ cm$^{-3}$. The film thickness of the n$^-$-type SiC epitaxial layer (the first SiC epitaxial layer) 202 is approximately 5 to 10 μm, for example. The N concentration may be a constant value within the above range, or may exhibit a concentration gradient within the above range.

In a case where the n$^-$-type SiC epitaxial layer 202 contains a p-type impurity and an n-type impurity, and the p-type impurity is an element A while the n-type impurity is an element D, the element A and the element D are a combination of Al (aluminum), Ga (gallium), or In (indium) and N (nitrogen), and/or a combination of B (boron) and P (phosphorus). The ratio of the concentration of the element A to the concentration of the element D in the combination (s) is higher than 0.40 but lower than 0.95. With this arrangement, resistance becomes lower, and defects are reduced.

So as to lower resistance, the ratio of the concentration of the element A to the concentration of the element D in the n-type SiC epitaxial layer 202 is preferably not lower than 0.45 and not higher than 0.75, the donor levels of the element D are preferably 40 meV or lower, and 90% or more of the element A is preferably located in the lattice site location nearest to the element D.

A p-type first SiC region (a p-well region) 216 containing a p-type impurity at an impurity concentration of approximately $5\times10^{15}$ to $1\times10^{17}$ cm$^{-3}$ is formed in part of the surface of the n-type SiC epitaxial layer 202. The depth of the p-well region 216 is approximately 0.6 μm, for example. The p-well region 216 functions as the channel region of the MOSFET.

An n$^+$-type second SiC region (a source region) 218 containing an n-type impurity at an impurity concentration of approximately $1\times10^{18}$ to $1\times10^{22}$ cm$^{-3}$, for example, is formed in part of the surface of the first SiC region (the p-well region) 216. The depth of the source region 218 is smaller than the depth of the first SiC region (the p-well region) 216, and is approximately 0.3 μm, for example.

A p$^+$-type third SiC region (a p-well contact region) 220 containing a p-type impurity at an impurity concentration of approximately $1\times10^{18}$ to $1\times10^{22}$ cm$^{-3}$, for example, is also formed in part of the surface of the first SiC region (the p-well region) 216 and on a side of the n$^+$-type second SiC region (the source region) 218. The depth of the p-well contact region 220 is smaller than the depth of the first SiC region (the p-well region) 216, and is approximately 0.3 μm, for example.

A gate insulating film 228 is formed continuously on the surfaces of the n$^-$-type SiC epitaxial layer 202 and the first SiC region (the p-well region) 216, so as to bridge the region and the layer. The gate insulating film 228 may be an SiO$_2$ film or a high-k insulating film, for example.

A gate electrode 230 is formed on the gate insulating film 228. The gate electrode 230 may be made of polysilicon, for example. An interlayer insulating film 232 formed with an SiO$_2$ film, for example, is formed on the gate electrode 230.

The first SiC region 216 interposed between the second SiC region (the source region) 218 under the gate electrode 230 and the n$^-$-type SiC epitaxial layer 202 functions as the channel region of the MOSFET.

A conductive first electrode (a source/p-well common electrode) 224 that is electrically connected to the second SiC region (the source region) 218 and the third SiC region (the p-well contact region) 220 is then formed. The first electrode (the source/p-well common electrode) 224 is formed with an Ni (nickel) barrier metal layer 224a and an Al metal layer 224b formed on the barrier metal layer 224a, for example. The Ni barrier metal layer 224a and the Al metal layer 224b may form an alloy through a reaction.

A conductive second electrode (a drain electrode) 236 is formed on the second face side of the SiC substrate 200. The second electrode (the drain electrode) 236 is made of Ni, for example.

In this embodiment, the n-type impurity is preferably N (nitrogen) or P (phosphorus), for example, but it is possible to use As (arsenic) or the like. Also, the p-type impurity is preferably Al (aluminum), for example, but it is possible to use B (boron), Ga (gallium), In (indium), or the like.

According to this embodiment, the n$^-$-type SiC epitaxial layer 202 serving as the drift layer is a co-doped n-type impurity layer. As a result, a low resistance and a low defect concentration are realized. The n-type SiC epitaxial layer 204 is also a co-doped n-type impurity layer. As a result, a low resistance and a low defect concentration are realized, and BPDs are prevented from expanding from the n-type SiC substrate 200 into the n-type SiC epitaxial layer 202. Accordingly, a MOSFET that has a low ON resistance and higher reliability is realized.

Although a vertical MOSFET using an n-type substrate has been described above as an example, an IGBT (Insulated Gate Bipolar Transistor) using a p-type SiC substrate instead can also be formed. In this IGBT, a low ON resistance and higher reliability are realized, as in the MOSFET.

Although SiC (silicon carbide) crystalline structures are 4H—SiC structures in the above described embodiments, the embodiments can also be applied to other crystalline structures such as 6H—SiC and 3C—SiC structures.

Also, in the above described embodiments, the combination of a p-type impurity and an n-type impurity is a combination of Al (aluminum) and N (nitrogen). However, the combination is not limited to that, and the same effects as above can be achieved, as long as the combination is a combination of Al (aluminum), Ga (gallium), or In (indium) and N (nitrogen), and/or a combination of B (boron) and P (phosphorus).

Although homoepitaxial growth of SiC grown on SiC has been described in the above embodiments, the embodiments can also be applied to heteroepitaxial growth to grow SiC on a substrate made of a material other than SiC.

Also, in the above embodiments the vapor phase growth apparatuses are a single-wafer processing epitaxial growth apparatus and an HTCVD apparatus as examples. However, the embodiments can also be applied to other vapor phase growth apparatuses such as an apparatus of a planetary type.

While certain embodiments have been described, these embodiments have been presented by way of example only, and are not intended to limit the scope of the inventions. Indeed, the sic epitaxial wafer and the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. An SiC epitaxial wafer comprising:
   an SiC substrate; and
   a p-type first SiC epitaxial layer formed on the SiC substrate, the first SiC epitaxial layer containing a p-type impurity and an n-type impurity, the p-type impurity being an element A and the n-type impurity being an element D, the element A and the element D forming at least a first combination or a second combination, the first combination being a combination of the element A selected from a group consisting of Al (aluminum), Ga (gallium), and In (indium) and the element D being N (nitrogen), the second combination being a combination of the element A being B (boron) and the element D being P (phosphorus), a ratio of a concentration of the element D to a concentration of the element A forming at least one of the combinations being higher than 0.33 but lower than 1.0.

2. The wafer according to claim 1, further comprising:
   an n-type second SiC epitaxial layer formed between the SiC substrate and the first SiC epitaxial layer; and
   a p-type third SiC epitaxial layer formed between the second SiC epitaxial layer and the first SiC epitaxial layer, the third SiC epitaxial layer having a lower p-type impurity concentration than the first SiC epitaxial layer,
   wherein
   the SiC substrate is an n-type SiC substrate and has a higher n-type impurity concentration than the second SiC epitaxial layer, and
   the concentration of the element A is not lower than $1 \times 10^{18}$ cm$^{-3}$ and not higher than $1 \times 10^{22}$ cm$^{-3}$.

3. The wafer according to claim 1, wherein the ratio of the concentration of the element D to the concentration of the element A is higher than 0.40 but lower than 0.95.

4. The wafer according to claim 1, wherein an acceptor level of the element A is 150 meV or lower.

5. The wafer according to claim 1, wherein 90% or more of the element D is in a lattice site location nearest to the element A.

6. An SiC epitaxial wafer comprising:
   an SiC substrate; and
   an n-type first SiC epitaxial layer formed on the SiC substrate, the first SiC epitaxial layer containing a p-type impurity and an n-type impurity, the p-type impurity being an element A and the n-type impurity being an element D, the element A and the element D forming at least a first combination or a second combination, the first combination being a combination of the element A selected from a group consisting of Al (aluminum), Ga (gallium), and In (indium) and the element D being N (nitrogen), the second combination being a combination of the element A being B (boron) and the element D being P (phosphorus), a ratio of a concentration of the element A to a concentration of the element D forming at least one of the combinations being higher than 0.40 but lower than 0.95.

7. The wafer according to claim 6, further comprising
   an n-type second SiC epitaxial layer formed between the SiC substrate and the first SiC epitaxial layer, the second SiC epitaxial layer containing a p-type impurity and an n-type impurity, the p-type impurity being an element A and the n-type impurity being an element D, the element A and the element D forming at least a first combination or a second combination, the first combination being a combination of the element A selected from a group consisting of Al (aluminum), Ga (gallium), and In (indium) and the element D being N (nitrogen), the second combination being a combination of the element A being B (boron) and the element D being P (phosphorus), a ratio of a concentration of the element A to a concentration of the element D forming at least one of the combinations being higher than 0.40 but lower than 0.95,
   wherein
   the SiC substrate is an n-type SiC substrate, and the concentration of the n-type impurity in the second SiC epitaxial layer is lower than an n-type impurity concentration in the SiC substrate and is higher than the concentration of the n-type impurity in the first SiC epitaxial layer, and
   the concentration of the element D in the first SiC epitaxial layer is not lower than $1 \times 10^{15}$ cm$^{-3}$ and not higher than $5 \times 10^{16}$ cm$^{-3}$.

8. The wafer according to claim 6, wherein the ratio of the concentration of the element A to the concentration of the element D is not lower than 0.45 and not higher than 0.75.

9. The wafer according to claim 6, wherein a donor level of the element D is 40 meV or lower.

10. The wafer according to claim 6, wherein 90% or more of the element A is in a lattice site location nearest to the element D.

11. A semiconductor device comprising:

an n-type first SiC epitaxial layer;

a p-type second SiC epitaxial layer formed on the first SiC epitaxial layer, the second SiC epitaxial layer containing a p-type impurity and an n-type impurity, the p-type impurity being an element A and the n-type impurity being an element D, the element A and the element D forming at least a first combination or a second combination, the first combination being a combination of the element A selected from a group consisting of Al (aluminum), Ga (gallium), and In (indium) and the element D being N (nitrogen), the second combination being a combination of the element A being B (boron) and the element D being P (phosphorus), a ratio of a concentration of the element D to a concentration of the element A in the at least one of the combinations being higher than 0.33 but lower than 1.0, the concentration of the element A forming at least one of the combinations being not lower than $1 \times 10^{18}$ cm$^{-3}$ and not higher than $1 \times 10^{22}$ cm$^{-3}$;

a first electrode formed on the second SiC epitaxial layer;

a second electrode formed on the opposite side of the first SiC epitaxial layer from the first electrode; and a groove portion formed on both sides of the first electrode, the groove portion extending from a surface of the second SiC epitaxial layer to the first SiC epitaxial layer.

12. The device according to claim 11, further comprising a p-type third SiC epitaxial layer formed between the first SiC epitaxial layer and the second SiC epitaxial layer, the third SiC epitaxial layer having a lower p-type impurity concentration than the second SiC epitaxial layer.

13. The device according to claim 11, wherein the ratio of the concentration of the element D to the concentration of the element A is higher than 0.40 but lower than 0.95.

14. The device according to claim 11, wherein an acceptor level of the element A is 150 meV or lower.

15. The device according to claim 11, wherein 90% or more of the element D is in a lattice site location nearest to the element A.

16. A semiconductor device comprising:

an n-type first SiC epitaxial layer containing a p-type impurity and an n-type impurity, the p-type impurity being an element A and the n-type impurity being an element D, the element A and the element D forming at least a first combination or a second combination, the first combination being a combination of the element A selected from a group consisting of Al (aluminum), Ga (gallium), and In (indium) and the element D being N (nitrogen), the second combination being a combination of the element A being B (boron) and the element D being P (phosphorus), a ratio of a concentration of the element A to a concentration of the element D forming at least one of the combinations being higher than 0.40 but lower than 0.95;

a p-type first SiC region formed in a surface of the first SiC epitaxial layer;

an n-type second SiC region formed in a surface of the first SiC region;

a gate insulating film formed continuously on the surfaces of the first SiC epitaxial layer and the first SiC region;

a gate electrode formed on the gate insulating film;

a first electrode formed on the second SiC region; and a second electrode formed on the opposite side of the first SiC epitaxial layer from the first electrode.

17. The device according to claim 16, wherein the concentration of the element D in the first SiC epitaxial layer is not lower than $1 \times 10^{15}$ cm$^{-3}$ and not higher than $5 \times 10^{16}$ cm$^{-3}$.

18. The device according to claim 16, wherein the ratio of the concentration of the element A to the concentration of the element D is not lower than 0.45 and not higher than 0.75.

19. The device according to claim 16, wherein a donor level of the element D is 40 meV or lower.

20. The device according to claim 16, wherein 90% or more of the element A is in a lattice site location nearest to the element D.

* * * * *

UNITED STATES PATENT AND TRADEMARK OFFICE
CERTIFICATE OF CORRECTION

| | | |
|---|---|---|
| PATENT NO. | : 8,933,464 B2 | Page 1 of 1 |
| APPLICATION NO. | : 14/205792 | |
| DATED | : January 13, 2015 | |
| INVENTOR(S) | : Johji Nishio et al. | |

It is certified that error appears in the above-identified patent and that said Letters Patent is hereby corrected as shown below:

On the title page Item (54) and in the specification, Column 1, the title information is incorrect. Item (54) and Column 1 should read:

-- SiC EPITAXIAL WAFER AND SEMICONDUCTOR DEVICE --

Signed and Sealed this
Twenty-eighth Day of April, 2015

Michelle K. Lee
*Director of the United States Patent and Trademark Office*